United States Patent
Huang

(10) Patent No.: US 9,327,967 B2
(45) Date of Patent: May 3, 2016

(54) MICRO-ELECTRO-MECHANICAL TRANSDUCER HAVING AN OPTIMIZED NON-FLAT SURFACE

(71) Applicant: Kolo Technologies, Inc., San Jose, CA (US)

(72) Inventor: Yongli Huang, San Jose, CA (US)

(73) Assignee: Kolo Technologies, Inc., San Jose, CA (US)

(*) Notice: Subject to any disclaimer, the term of this patent is extended or adjusted under 35 U.S.C. 154(b) by 0 days.

(21) Appl. No.: 14/642,306

(22) Filed: Mar. 9, 2015

(65) Prior Publication Data

US 2015/0181348 A1    Jun. 25, 2015

Related U.S. Application Data

(60) Continuation of application No. 13/229,553, filed on Sep. 9, 2011, now Pat. No. 8,975,984, which is a continuation of application No. 13/018,162, filed on Jan. 31, 2011, now Pat. No. 8,018,301, which is a division of application No. 12/568,225, filed on Sep. 28, 2009, now Pat. No. 7,880,565, which is a continuation of application No. 11/462,333, filed on Aug. 3, 2006, now Pat. No. 7,612,635.

(60) Provisional application No. 60/705,606, filed on Aug. 3, 2005.

(51) Int. Cl.
| | |
|---|---|
| *H03H 7/00* | (2006.01) |
| *H03H 7/01* | (2006.01) |
| *H03H 3/007* | (2006.01) |
| *H03H 9/02* | (2006.01) |
| *H03H 9/24* | (2006.01) |
| *H03H 9/46* | (2006.01) |
| *B81C 1/00* | (2006.01) |

(Continued)

(52) U.S. Cl.
CPC ........ *B81C 1/00626* (2013.01); *B81B 3/0027* (2013.01); *B81C 1/00158* (2013.01); *H02N 1/006* (2013.01); *H03H 3/0072* (2013.01); *H03H 9/02259* (2013.01); *H03H 9/2405* (2013.01); *H03H 9/462* (2013.01); *H04R 19/005* (2013.01); *B81C 1/00357* (2013.01); *B81C 1/00373* (2013.01); *B81C 1/00523* (2013.01); *H01L 2924/0002* (2013.01); *Y10T 29/42* (2015.01); *Y10T 29/49005* (2015.01)

(58) Field of Classification Search
None
See application file for complete search history.

(56) References Cited

U.S. PATENT DOCUMENTS

| | | | |
|---|---|---|---|
| 2,975,307 A | 3/1961 | Schroeder et al. | |
| 5,578,976 A | 11/1996 | Yao | |

(Continued)

FOREIGN PATENT DOCUMENTS

WO    WO2004084300 A1    9/2004

OTHER PUBLICATIONS

Office Action for U.S. Appl. No. 13/229,553, mailed on Apr. 9, 2014, Yongli Huang, "Micro-Electro-Mechanical Transducer Having an Optimized Non-Flat Surface", 10 pages.

*Primary Examiner* — Anh Tran
(74) *Attorney, Agent, or Firm* — Mattingly & Malur, P.C.

(57) ABSTRACT

A capacitive micromachined ultrasound transducer (cMUT) and fabrication method of the same are provided. The cMUT has a substrate, a curved membrane disposed on top of the substrate, and a flexible membrane disposed on top of the curved membrane. The curved membrane has a raised portion which is higher than a recessed portion relative to the substrate, and is supported by a support standing on a major surface of the substrate. The flexible membrane includes a first region mounted to the raised portion of the curved membrane, and a second region extending over the recessed portion of the curved member. Methods for fabricating the cMUT are also disclosed.

24 Claims, 26 Drawing Sheets

(51) Int. Cl.
*H02N 1/00* (2006.01)
*B81B 3/00* (2006.01)
*H04R 19/00* (2006.01)

(56) References Cited

U.S. PATENT DOCUMENTS

| | | | |
|---|---|---|---|
| 5,894,452 A | 4/1999 | Ladabaum et al. |
| 6,002,117 A | 12/1999 | Pak |
| 6,004,832 A | 12/1999 | Haller et al. |
| 6,271,620 B1 | 8/2001 | Ladabaum |
| 6,283,601 B1 | 9/2001 | Hagelin et al. |
| 6,384,353 B1 | 5/2002 | Huang et al. |
| 6,424,165 B1 | 7/2002 | de Boer et al. |
| 6,473,361 B1 | 10/2002 | Chen et al. |
| 6,503,847 B2 | 1/2003 | Chen et al. |
| 6,600,587 B2 | 7/2003 | Sniegowski et al. |
| 6,700,688 B2 | 3/2004 | Vaganov |
| 6,858,653 B1 | 2/2005 | Bessette |
| 6,956,389 B1 | 10/2005 | Mai |
| 6,958,255 B2 | 10/2005 | Khuri-Yakub et al. |
| 7,321,185 B2 | 1/2008 | Schultz |
| 7,489,593 B2 | 2/2009 | Nguyen-Dinh et al. |
| 8,531,919 B2 | 9/2013 | Cheng et al. |
| 8,787,116 B2 | 7/2014 | Petruzzello et al. |
| 2002/0031294 A1 | 3/2002 | Takeda et al. |
| 2002/0041220 A1 | 4/2002 | Nguyen |
| 2002/0074670 A1 | 6/2002 | Suga |
| 2002/0096488 A1 | 7/2002 | Gulvin et al. |
| 2002/0149071 A1 | 10/2002 | Shim |
| 2003/0157783 A1 | 8/2003 | Fonash et al. |
| 2004/0027671 A1 | 2/2004 | Wu et al. |
| 2004/0085858 A1 | 5/2004 | Khuri-Yakub et al. |
| 2004/0250625 A1 | 12/2004 | Kogan et al. |
| 2005/0046504 A1 | 3/2005 | Xiaoyu et al. |
| 2005/0046922 A1 | 3/2005 | Lin et al. |
| 2005/0067919 A1 | 3/2005 | Horning |
| 2005/0075572 A1 | 4/2005 | Mills et al. |
| 2005/0096546 A1 | 5/2005 | Hazard et al. |
| 2005/0146241 A1 | 7/2005 | Wan |
| 2005/0146247 A1 | 7/2005 | Fisher et al. |
| 2005/0227400 A1 | 10/2005 | Chase et al. |
| 2005/0237858 A1 | 10/2005 | Thomenius et al. |
| 2005/0270128 A1 | 12/2005 | Nakanishi et al. |
| 2006/0004289 A1* | 1/2006 | Tian et al. ............ 600/459 |
| 2007/0074574 A1 | 4/2007 | Kogan et al. |
| 2007/0122074 A1 | 5/2007 | Kim et al. |
| 2011/0136284 A1 | 6/2011 | Huang |

* cited by examiner

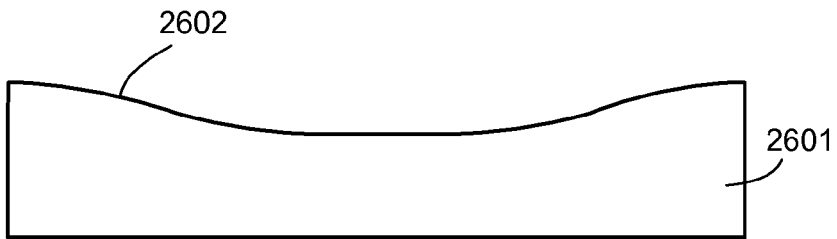
FIG. 26A
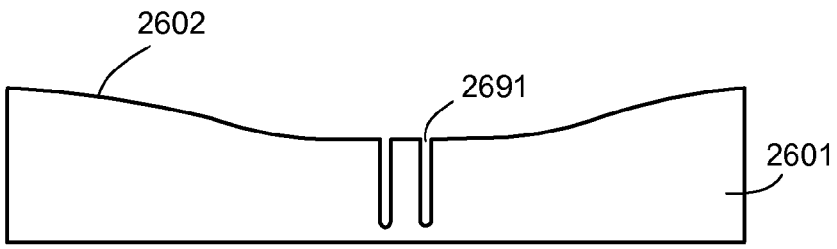
FIG. 26B
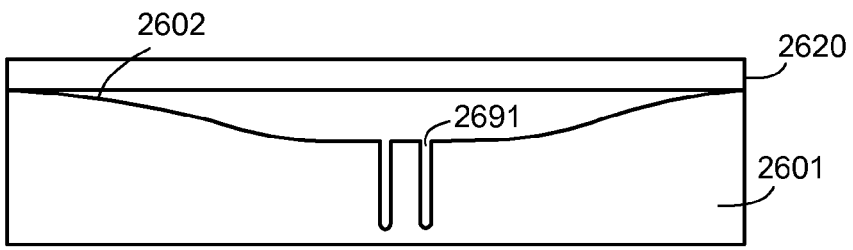
FIG. 26C
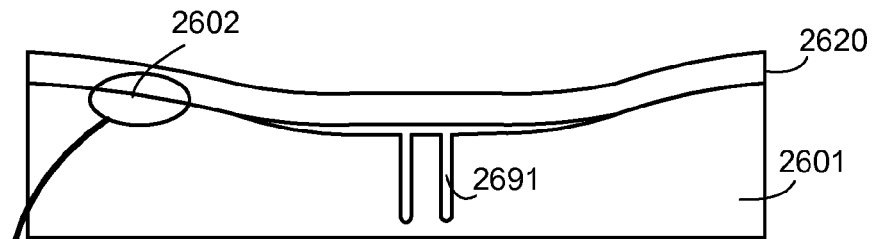
FIG. 26D
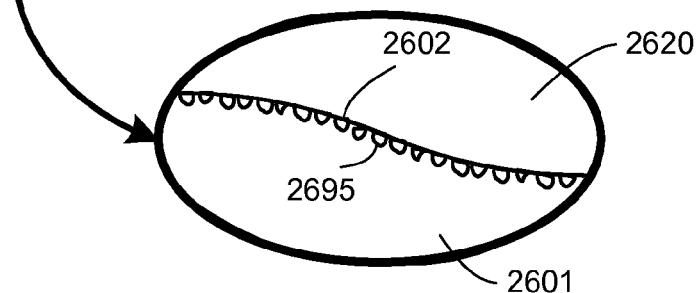

MICRO-ELECTRO-MECHANICAL TRANSDUCER HAVING AN OPTIMIZED NON-FLAT SURFACE

CROSS-REFERENCES TO RELATED APPLICATIONS

This application is a continuation of U.S. patent application Ser. No. 13/229,553, filed Sep. 9, 2011, which claims the benefit of priority to U.S. patent application Ser. No. 13/018, 162, filed Jan. 31, 2011, and issued as U.S. Pat. No. 8,018, 301, which claims priority to U.S. patent application Ser. No. 12/568,225, filed Sep. 28, 2009, and issued as U.S. Pat. No. 7,880,565, which claims priority to U.S. patent application Ser. No. 11/462,333, filed Aug. 3, 2006, and issued as U.S. Pat. No. 7,612,635, which claims the benefit of U.S. Provisional Application No. 60/705,606, filed Aug. 3, 2005, which applications are incorporated by reference herein in their entirety, and the benefit of the filing dates of these applications is claimed.

This application further incorporates by reference herein in entirety the following:

International Application (PCT) No. PCT/IB2006/051566, entitled THROUGH-WAFER INTERCONNECTION, filed on May 18, 2006;

International Application (PCT) No. PCT/IB2006/051567, entitled METHODS FOR FABRICATING MICRO-ELECTRO-MECHANICAL DEVICES, filed on May 18, 2006;

International Application (PCT) No. PCT/IB2006/051568, entitled MICRO-ELECTRO-MECHANICAL TRANSDUCERS, filed on May 18, 2006;

International Application (PCT) No. PCT/IB2006/051569, entitled MICRO-ELECTRO-MECHANICAL TRANSDUCERS, filed on May 18, 2006;

International Application (PCT) No. PCT/IB2006/051948, entitled MICRO-ELECTRO-MECHANICAL TRANSDUCER HAVING AN INSULATION EXTENSION, filed on Jun. 16, 2006;

International Application (PCT) PCT/IB2006/052657, entitled MICRO-ELECTRO-MECHANICAL TRANSDUCER HAVING AN OPTIMIZED NON-FLAT SURFACE, filed on Aug. 3, 2006; and U.S. patent application Ser. No. 11/425,128, entitled FLEXIBLE MICRO-ELECTRO-MECHANICAL TRANSDUCER, filed on Jun. 19, 2006; and International Application (PCT) PCT/IB2006/052658, entitled MICRO-ELECTRO-MECHANICAL TRANSDUCER HAVING A SURFACE PLATE, filed on Aug. 3, 2006.

Any disclaimer that may have occurred during the prosecution of any of the above-referenced applications is expressly rescinded, and reconsideration of all documents of record is respectfully requested.

FIELD

The present disclosure relates to micro-electro-mechanical devices that have a movable mechanical part, particularly to micromachined ultrasonic transducers (MUT) such as capacitance micromachined ultrasonic transducers (cMUT).

BACKGROUND

Micro-electro-mechanical transducers usually share a common feature which includes a movable mechanical part used for energy transformation. One example of such micro-electro-mechanical transducers is micromachined ultrasonic transducers (MUT). An ultrasound transducer performs a chain of energy transformation to realize its function of a transducer. In its receiving mode, the acoustic energy of ultrasound waves propagating in a medium where the transducer is placed is transformed to mechanical energy of a movable part (conventionally a vibrating membrane) in the transducer. The motion of the movable part is then transformed to a detectable electromagnetic (usually electrical) signal. In its transmitter mode, the reverse chain of energy transformation takes place.

Various types of ultrasonic transducers have been developed for transmitting and receiving ultrasound waves. Ultrasonic transducers can operate in a variety of media including liquids, solids and gas. These transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and many others. In addition to discrete ultrasound transducers, ultrasound transducer arrays containing multiple transducers have been also developed. For example, two-dimensional arrays of ultrasound transducers are developed for imaging applications.

Compared to the widely used piezoelectric (PZT) ultrasound transducer, the MUT has advantages in device fabrication method, bandwidth and operation temperature. For example, making arrays of conventional PZT transducers involves dicing and connecting individual piezoelectric elements. This process is fraught with difficulties and high expenses, not to mention the large input impedance mismatch problem presented by such elements to transmit/receiving electronics. In comparison, the micromachining techniques used in fabricating MUTs are much more capable in making such arrays. In terms of performance, the MUT demonstrates a dynamic performance comparable to that of PZT transducers. For these reasons, the MUT is becoming an attractive alternative to the piezoelectric (PZT) ultrasound transducers.

Among the several types of MUTs, the capacitive micromachined ultrasonic transducer (cMUT), which uses electrostatic transducers, is widely used. FIG. 1 shows a cross-sectional view of a basic structure of a prior art cMUT. The cMUT 10 of FIG. 1 is built on a substrate 11. Each cMUT cell has a parallel plate capacitor consisting of a rigid bottom electrode 12 and a top electrode 14 residing on or within a flexible membrane 16 that is used to transmit or receive an acoustic wave in the adjacent medium. The flexible membrane 16 in each cell is supported by the anchor 18. The membrane 16 is spaced from the substrate 11 and the top electrode 12 to define a transducing space 19 therebetween. A DC bias voltage is applied between the electrodes 12 and 14 to deflect the membrane 16 to an optimal position for cMUT operation, usually with the goal of maximizing sensitivity and bandwidth. During transmission an AC signal is applied to the transducer. The alternating electrostatic force between the top electrode and the bottom electrode actuates the membrane 16 in order to deliver acoustic energy into the medium (not shown) surrounding the cMUT 10. During reception the impinging acoustic wave vibrates the membrane 16, thus altering the capacitance between the two electrodes. An electronic circuit detects this capacitance change.

The two electrodes of the cMUT are usually desired to be parallel during operation to achieve optimum performance. Ideally, the top and bottom electrodes may both be rigid (that is, the deflection of both electrodes is much smaller than the change of the separation distance between two electrodes during the operation). However, in the cMUTs reported so far, at least part of one or both electrodes is made of flexible structures (e.g., a flexible membrane, cantilever, spring, etc.), so the dynamic status of the two electrodes during operation may not be parallel even if the two electrodes are designed to be substantially parallel to each other when static.

In addition, unlike PZT transducer, the electrostatic force in cMUT is not linearly proportional to the applied voltage and the electrode separation. This nonlinearity of the electrostatic actuation may degrade the transducer's performance and reliability.

Due to the importance of these MUT devices, it is desirable to improve the technology in terms of performance, functionality, and manufacturability in general, and to optimize transduction performance, breakdown voltage and parasitic capacitance reduction in particular. In order to increase the average electrical intensity and to enhance reliability, the shapes of the internal surfaces, such as the profile of the separation gap between two cMUT electrodes and the spring-substrate contact areas, may need to be optimized for a cMUT. This optimization is especially desired for correcting non-parallel motion between two electrodes and enhancing breakdown (collapse) voltage in the cMUT. Furthermore, new methods of fabrication are decided because designs having a special shaped surface may be difficult to fabricate using a conventional fabrication process given the very small separation between the cMUT electrodes.

SUMMARY

This patent application discloses a micro-electro-mechanical transducer (such as a cMUT) having a non-flat internal surface. The non-flat surface may include a variable curve or slope in an area where a spring layer contacts a support, thus making a variable spring model as the spring layer vibrates. The non-flat surface may also be that of a non-flat electrode optimized to compensate the dynamic deformation of the other electrode during operation and thus enhance the uniformity of the dynamic electrode gap during operation. Methods for fabricating the micro-electro-mechanical transducer are also disclosed. The methods may be used in both conventional membrane-based cMUTs and cMUTs having embedded springs transporting a rigid top plate.

One aspect of the present invention is a micro-electro-mechanical transducer comprising: a first layer having a first internal surface; a second layer having a second internal surface opposing the first internal surface of the first layer to define a gap therebetween; and a transducing member is movable with at least one of the first layer and the second layer. At least one of the first internal surface and the second internal surface is non-flat defining a shape profile having at least a first zone and a second zone, the first zone defining a first width of the gap, the first width being variable, and the second zone defining a second width of the gap.

In one embodiment, the first internal surface is non-flat, and the second layer is supported by a contacting portion of the first internal surface in the first zone. The second layer comprises a membrane layer supported by a graduated surface of the contacting portion of the first internal surface to form a wedge therebetween, and the membrane layer is deformable along the graduated surface, creating a varying contacting surface area in the wedge as the second layer is displaced nearer or closer in relation to the first layer. The contacting portion of the first internal surface may have a substantially smooth surface, rendering the first width of the transducing gap graduating continuously. Alternatively, the contacting portion of the first internal surface may have a stepped surface rendering the first width of the transducing gap graduating in steps.

In one embodiment, the first internal surface is non-flat, while the second layer is subject to a deformation during operation of the micro-electro-mechanical transducer, and the non-flat first internal surface has a shape that generally conforms to the deformation of the second layer during operation. In an exemplary optimized design, the second layer is subject to a maximum deformation in the second zone during operation of the micro-electro-mechanical transducer. If the deformation of the second layer during operation has a downward bulge toward the first layer in the second zone, the first internal surface in the second zone may be designed to have a recess relative to the first internal surface in the first zone. The recess at least partially conforms to the deformation of the second layer during operation to reduce the non-uniformity of the change of the transducing gap.

In one embodiment, the first layer comprises a substrate, the second layer comprises a spring layer movable through the gap defined between the first layer and the second layer, and the transducing member comprises a first electrode movable with the spring layer.

In another embodiment, the first layer comprises a mass layer, the second layer comprises a spring layer movable through the gap defined between the first layer and the second layer. The spring layer is connected to a substrate, and the transducing member comprises a first electrode movable with the spring layer. The first electrode may be disposed on the spring layer, and the transducing member may further comprise a second electrode disposed on the substrate. Alternatively, the first electrode may be disposed on the mass layer, and the transducing member further may comprise a second electrode disposed on the spring layer.

In another embodiment, at least one of the first layer and the second layer comprises a resilient membrane.

In one embodiment, the first layer comprises a protruding portion in the first zone. The protruding portion has a tapered surface providing graduated contact with the second layer to support the second layer.

In one embodiment, the first layer comprises a substrate and a spring layer placed over the substrate. The substrate and the spring layer defines a cavity therebetween, the cavity is bordered by a sidewall, and the spring layer extending from the sidewall to cover the cavity. The spring layer may comprise a conductive layer. The substrate may also comprise a conductive material. In one embodiment, the second layer comprises a top plate with a protruding portion having a tapered surface providing graduated contact with the spring layer, wherein the protruding portion separates the top plate from the spring layer. The top plate may comprise a silicon/polysilicon layer. In one embodiment, the top plate is significantly more rigid than the spring layer and is substantially unbent when transported by a vertical displacement of the protruding portion.

In another embodiment, the first layer comprises a substrate including a spring anchor, and the second layer comprises a spring layer and a mass layer, the mass layer being connected to the spring layer through a spring-mass connector, and the spring layer is anchored at the spring anchor. The spring anchor may have a sloped shoulder defining the first zone, wherein the sloped shoulder contacts with the spring layer to form a wedge therebetween, and the spring layer is deformable along the sloped shoulder, creating a varying contacting surface area in the wedge as the spring layer is bent nearer or closer in relation to the substrate.

In some embodiments, the micro-electro-mechanical transducer further comprises a motion stopper disposed in the gap between the first internal surface and the second internal surface. The motion stopper may be disposed on one of the first internal surface and the second internal surface that is non-flat. The motion stopper desirably comprises an insulating material and in a preferred embodiment further includes an insulation extension extending into one of the first internal surface and the second internal surface.

Another aspect of the present invention is a micro-electro-mechanical transducer comprising a base layer including a first electrode; a spring layer including a second electrode separated from the first electrode defining an electrode gap therebetween; and a support member supporting the spring layer such that the spring layer is adapted for vibration relative to the base layer during transmitting or receiving a signal. One of the first electrode and the second electrode has a deformable area subject to deformation during operation, and the other electrode has a non-flat area at least partially conformed to the deformation of the deformable area of the one of the first electrode and the second electrode to increase uniformity of the electrode gap during operation.

In one embodiment, the support member has a graduated surface facing the spring layer, and the spring layer is deformable along the graduated surface of the support member, such that the spring layer has a varying surface area in contact with the support member when the spring layer is displaced nearer or closer in relation to the other layer. The graduated surface of the support member may comprise a step having at least two different levels. The support member may be integral with the base layer or the spring layer.

In one embodiment, the base layer comprises a mass layer connected to the spring layer through a spring-mass connector. In one embodiment, support member comprises a substrate and an anchor standing on the substrate; the spring layer is placed over the anchor to define a cavity between the spring layer and the substrate; and the cavity is bordered by the anchor, the spring layer extending from the anchor to cover the cavity. The support member may be an integral part of the substrate. The substrate may comprise a conductive material. The mass layer may be significantly more rigid than the spring layer and be substantially unbent when transported by a vertical displacement of the support members.

In another aspect of the present invention is a micro-electro-mechanical transducer comprising: a first layer including a spring layer and a first electrode; a second layer including a second electrode; and a spring anchor supporting the spring layer to form a cantilever having a variable cantilever length. At least one of the first layer and the second layer has a non-flat surface defining a nonuniform gap therebetween. In one embodiment, the spring layer contacts a curved surface of the spring anchor, and the variable cantilever length varies as the spring layer deforms along the curved surface of the spring anchor. In another embodiment, the spring layer is connected to a curved surface the second layer, and the variable cantilever length varies as the spring layer deforms along the curved surface of the second layer. In yet another embodiment, the spring layer is connected to the second layer through a connector having a curved surface, and the variable cantilever length varies as the spring layer deforms along the curved surface of the connector.

In one embodiment, the second layer is a rigid surface plate. Alternatively, the second layer comprises a substrate having a cavity over which the cantilever extends, and the micro-electro-mechanical transducer further comprises a mass layer connected to the spring layer through a spring-mass connector.

Another aspect of the present invention is a method for fabricating a micro-electro-mechanical transducer. The method comprises the steps of:

(a) growing and patterning diffusion barrier layer over a surface of a base layer, the diffusion barrier layer having an opening leaving a corresponding part of the surface of the base layer uncovered;

(b) performing a diffusion process over the diffusion barrier layer including the opening such that a diffusion reactivated material reaches a first depth into the base layer at where the opening is located and a second depth into the base layer at positions covered by the diffusion barrier layer, the first depth being greater than the second depth;

(c) removing the diffusion barrier layer and the diffusion reactivated material to form a step on the surface of the base layer; and (d) forming a cover layer over the stepped surface of the base layer to define a stepped gap therebetween.

The diffusion barrier layer may be an oxide layer, a nitride layer or a combination thereof. The diffusion reactivated material may be an oxide. The steps of (a), (b), and (c) may be repeated to form additional levels (steps) of the surface of the base layer. Before forming the cover layer, an anchor may be formed on the stepped surface of the base layer. The anchor is taller than the stepped surface such that the cover layer is supported by the anchor and clear of the stepped surface of the base layer. Furthermore, an insulation layer may be formed over the stepped surface of the base layer; the base layer may have a conductive material; the cover layer may also have a conductive material. Alternatively, the cover layer can be placed directly on a protruding portion of stepped surface.

In some embodiments, the step of forming the cover layer comprises: bonding an SOI layer carrying the cover layer over the stepped surface of the base layer; and etching back the SOI layer to leave the cover layer over the stepped surface of the base layer.

In some embodiments, the step of growing and patterning diffusion barrier layer comprises: growing and patterning a first diffusion barrier layer over a surface of a base layer; and growing and patterning a second diffusion barrier layer over the first diffusion barrier layer.

In one embodiment, the cover layer comprises a membrane layer having a perimeter fixed at a support wall on the base layer.

In another embodiment, the cover layer comprises a spring layer anchored at a spring anchor on the base layer to form a cantilever. The base layer may comprise a substrate, the method may further comprise forming a mass layer over the spring layer, the mass layer being connected to the spring layer through a spring-mass connector.

Another aspect to the present invention is a method for fabricating a micro-electro-mechanical transducer, the method comprising the steps of: forming a plurality of posts on a substrate, each post having a top end standing from the substrate; rounding corners of the top ends of the plurality of posts to form a tapered top surface on each post; and introducing a membrane layer over the top ends of the plurality of posts. In one embodiment, the base layer comprises a substrate and the cover layer comprises a spring layer. In another embodiment, the base layer comprises a mass layer and the cover layer comprises a spring layer connected to a substrate.

In one embodiment, the step of rounding corners of the top ends of the plurality of posts comprises treating the plurality of posts using hydrogen annealing at a desired temperature. In another embodiment, the step of rounding corners of the top ends of the plurality of posts comprises oxidizing the top ends. Furthermore, an insulation layer may be formed over the tapered top surface of the plurality of posts.

Another aspect of the present invention is a method for fabricating a micro-electro-mechanical transducer, the method comprising the steps of: (a) forming a non-flat surface on a first wafer, the non-flat surface comprising a first area having a first height and a second area having a second height, the first height being greater than the second height, wherein the first area has a tapered top surface; (b) forming a membrane layer over the tapered top surface of the first area of the first wafer; (c) forming a post on the membrane layer or a second wafer, the post having a top surface standing away from the second wafer; and (d) bonding the second wafer to the membrane layer with the post contacting disposed therebetween.

The stepped surface on the first wafer may be formed using methods as described in the other embodiments of the present invention, such as growing and patterning oxide and/or nitride layers over a surface of the first wafer. The first wafer may be an SOI wafer including a plate layer, the method further comprising etching back the SOI wafer to leave the plate layer in the micro-electro-mechanical transducer.

Another aspect of the invention is a method for fabricating a micro-electro-mechanical transducer, the method comprising the steps of: forming a flexible layer having a desired thickness profile; placing the flexible layer over a base layer such that the flexible layer is supported by a support wall, the flexible layer and the base layer defining a cavity therebetween; and bending the flexible layer into a desired shape. The support wall may be formed either on the base layer or on the flexible layer. The flexible layer may be bent downward to the base layer such that at least a part of the flexible layer contacts a surface of the base layer in the cavity. The flexible layer may be bent upward from the base layer.

In one embodiment, the thickness profile of the flexible layer comprises a first wall having a first height and a second wall having a second height. The first height is greater than the second height. The flexible layer contacts the base layer through the first wall before bending. The flexible layer may be bent downward such that the flexible layer contacts the base layer through the second wall after bending. The flexible layer may alternatively be bent upward such that the flexible layer has a raised top surface above the second wall after bending.

In one embodiment, a membrane layer is placed over the bent flexible layer, wherein the membrane layer is supported by a support member to define a nonuniform transducing gap between the membrane layer and the bent flexible layer. The support member may be a protruding portion of the bent flexible layer. The support member may be a post formed on the bent flexible layer.

Yet another aspect of the present invention is a method for fabricating a micro-electro-mechanical transducer, the method comprising the steps of:

(a) forming a wall on a substrate, the wall defining a cavity;

(b) placing a first membrane layer over the cavity such that the first membrane layer is supported by the wall on the substrate, the first membrane and the substrate together comprising a bottom electrode or being adapted for hosting a bottom electrode;

(c) bending the first membrane layer into a desired shape; and (d) placing a second membrane layer over the first membrane layer, wherein the second membrane layer comprises a top electrode or being adapted for hosting a top electrode, and the second membrane layer and the bent first membrane layer define a transducing gap having a nonuniform width.

In one embodiment, the first membrane layer is bent downward such that a part of the first membrane layer touches the substrate after bending and is bonded thereto. In another embodiment, the first membrane layer is bent upward such that a part of the first membrane layer has a raised top surface.

Bending the first membrane layer may be accomplished by annealing the first membrane layer at a desired temperature and pressure. Using a semiconductor material for the first membrane layer, bending the first membrane layer may be accomplished by selectively doping the first membrane layer using a doping material with a doping profile to introduce a desired stress profile in the first membrane layer, and annealing the doped first membrane layer at a desired temperature and pressure. Alternatively, bending the first membrane layer may be accomplished by forming a stress layer on the first membrane layer, and annealing the first membrane layer and the stress layer at a desired temperature and pressure. The stress layer has a desired stress profile to assist bending the membrane layer.

In one embodiment, before placing the second membrane layer over the first membrane layer, an insulation layer is formed over the first membrane layer.

The foregoing and other features and advantages will become more apparent from the following detailed description of several embodiments, which proceeds with reference to the accompanying figures.

BRIEF DESCRIPTION OF THE DRAWINGS

FIGS. 26A-26D show an exemplary fabrication process to roughen the bottom surface of the cavity and to fabricate buffer trenches on the bottom of the cavity.

DETAILED DESCRIPTION

Figure 1:
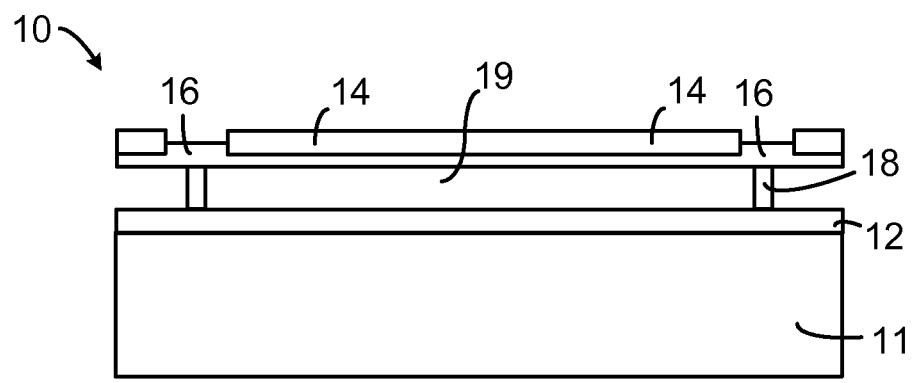
FIG. 1 shows a cross-sectional view of a basic structure of a prior art cMUT.

The micro-electro-mechanical transducer such as a capacitive micromachined ultrasonic transducer (cMUT) of the present invention will be described in detail along with the figures, in which like parts are denoted with like reference numerals or letters. Fabrication methods for making the micro-electro-mechanical transducer of the present invention are also disclosed. These methods may be used in combination with any suitable methods, particularly using the methods disclosed in the several patent applications identified herein.

The invention has been described below with reference to specific embodiments. In most cases, a cMUT structure is used to illustrate the invention. It is appreciated, however, that the present invention is not limited to cMUTs. It will be apparent to those skilled in the art that various modifications may be made and other embodiments can be used without departing from the broader scope of the inventions. Therefore, these and other variations upon the specific embodiments are intended to be covered by the present inventions. Those skilled in the art will recognize that various features disclosed in connection with the embodiments may be used either individually or jointly.

In this document, a conductive material is defined as one having a resistivity less than $1\times10^4$ $\Omega$-cm. Silicon and polysilicon materials are therefore considered conductive materials in this context. A good conductive material preferably has a resistivity less than 1 $\Omega$-cm. The terms "insulation material", "insulating material" and "dielectric material" are used interchangeably unless noted otherwise, and are defined as one having a resistivity greater than $1\times10^4$ $\Omega$-cm. A good insulation/insulating material preferably has a resistivity greater than $1\times10^8$ $\Omega$-cm. An insulator generally comprises an insulating material but in special cases may include air and vacuum.

It is noted that the terms "transducer" and "transducing member" are used in a broad sense in the present description to not only include devices that perform both actuation and sensing functions but also include devices that perform either an actuation function or an sensing function.

One aspect of the present invention relates to optimization of the shape of the separation gap between two electrodes in a micro-electro-mechanical transducer such as cMUT. In the figures used in this description, an exemplary cMUT design may be used to illustrate how to implement the design concepts and the methods into a cMUT design and fabrication. However, the designs and methods described herein may be generally used in the design and fabrication of any kind of cMUTs (e.g., cMUTs with embedded springs, and cMUTs with flexible membrane surface), and further many other types of micro-electro-mechanical transducers.

One characteristic of the prior art cMUT as shown in FIG. 1 is that in an unbiased and static condition, the two electrodes (12 and 14) are parallel to each other to define a uniform distance there between. This would be an effective configuration to achieve a uniform gap between two electrodes desired for optimal performance if the separation gap between two electrodes has a uniform change during operation (e.g., one electrode has a parallel movement relative to the other electrode during the transducer operation). However, in most cMUTs, at least one of two electrodes is deformed during the operation, either because of an electric bias applied or a dynamic deformation. As a result, the effective change of the separation gap between two electrodes becomes non-uniform, thus affecting the performance of the transducer. For example, the electrostatic field may work more efficiently at a location of a large deformation, and less or non-efficiently at a location of a small deformation.

Another related characteristic of the prior art cMUT is that the membrane area between the support anchors 18 is roughly a constant because of the non-gradual nature of the support anchors 18. This results in a relatively constant spring model. That is, the equivalent spring has a fixed spring mass and spring constant, except for a slight increase of the spring constant with deformation due to material stiffing effect under stress condition. Because the electrostatic pressure is not linearly proportional to the electrode separation, the displacement is not linearly proportional to the drive voltage. Moreover, for a cMUT, usually there exists a collapse voltage for a given electrode separation gap, and a minimum electrode separation gap for an applied voltage. A constant spring model therefore limits the transducer operation range (for both displacement and voltage) and causes some reliability problem. To alleviate these problems, the present invention discloses a micro-electro-mechanical transducer (such as a cMUT) with a variable spring constant to compensate the nonlinearity of the electrostatic pressure is desired.

Figure 2A:
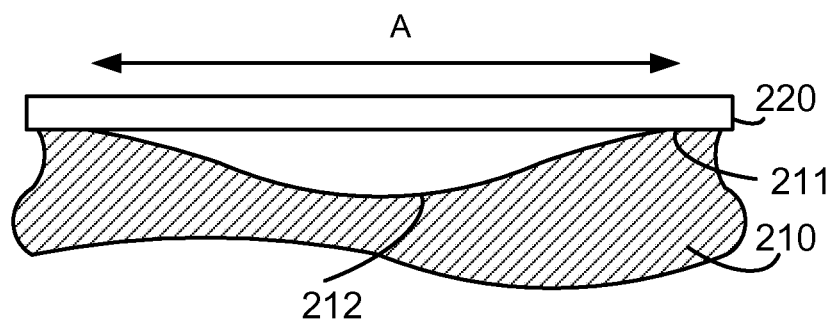
FIGS. 2A-2B show schematic views of a micro-electro-mechanical transducer having a non-flat electrode in accordance with the present invention.
Figure 2B:
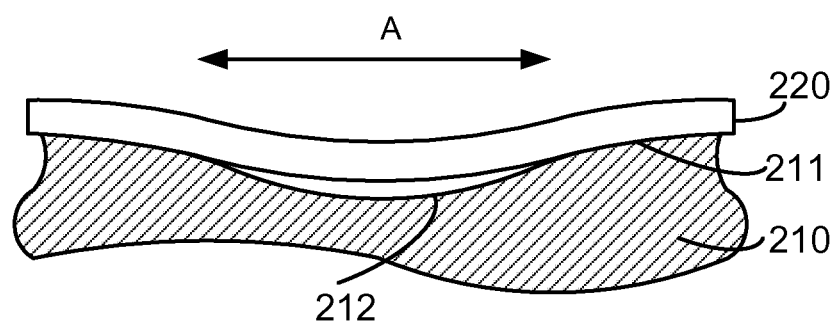

FIGS. 2A-2B show schematic views of a micro-electro-mechanical transducer having a non-flat internal surface in accordance with the present invention. The micro-electro-mechanical transducer has a bottom layer 210 and the top layer 220. The bottom layer 210 has a non-flat shape. In the example shown in FIG. 2A, the surface of the bottom layer 210 is curved and generally has two zones 211 and 212. The zone 211 contacts the top layer 220. The zone 211 has a graduated surface to form a wedge between the top layer 220 and the bottom layer 210. This provides a variable contacting area to the top layer 220 depending on the degree of deformation of the top layer 220.

The bottom layer 210 may provide a bottom electrode (not separately shown), either by including a separate conductive layer or by using a conductive material for the bottom layer 210 itself. The top layer 220 may provide a top electrode (not separately shown), either by including a separate conductive layer or by using a conductive material for the top layer 220 itself. If both the top layer 220 and the bottom layer 210 are fully covered by electrodes, a thin insulation layer (not shown) may need to be placed on the surface of one of the top layer 220 and the bottom layer 210. However, a top electrode or a bottom electrode does not have to cover the entire surface of the bottom layer 210 and further does not have to be in a non-flat shape as the surface of the bottom layer 210, unless a non-flat electrode is desired for improving uniformity of the electrode gap as shown below in FIGS. 3-5.

As shown in FIG. 2B, as the top layer 220 is displaced and bent toward the bottom layer 210, the contacting area in zone 211 increases. Correspondingly, the effective membrane spring area A for the spring model decreases, changing both the spring mass and the spring constant. This design thus effectively provides a dynamic spring model having a variable spring constant. This may be advantageous in terms of collapsing control. For example, as the voltage applied across the two electrodes increases, the effective membrane spring area A decreases to result in an increase in the spring strength of the vibrating membrane (top layer 220). This pushes the transducer collapse voltage higher. The collapse of the transducer may be avoided as long as the increasing spring strength is adequate to balance the electrostatic force.

Figure 3:
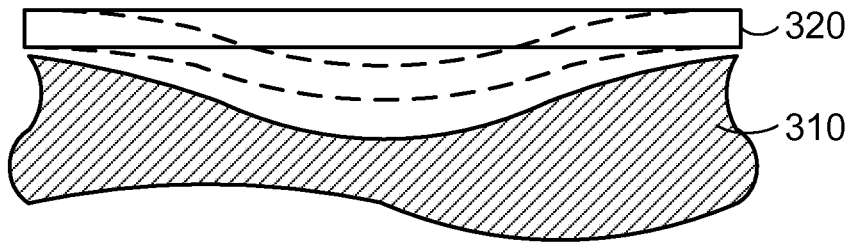
FIG. 3 shows a schematic view of another aspect of the micro-electro-mechanical transducer of the present invention.

FIG. 3 shows a schematic view of another aspect of the micro-electro-mechanical transducer of the present invention. The micro-electro-mechanical transducer in FIG. 3 has the same basic structure of the micro-electro-mechanical transducer in FIGS. 2A-2B except that at least one non-flat surface is an electrode surface. Bottom layer 310 provides a bottom electrode and the top layer 320 provides a top electrode. The bottom layer 310 has a non-flat (curved) shape which, in the particular example shown in FIG. 3, is characterized by a downward crater in the center. During operation, the top layer 320 has a deformed shape as represented by dashed lines. In the example shown, this dynamic deformation of the top layer 320 (including the top electrode therein) has a downward bulge. Preferably, the curved shape of the non-flat bottom layer (including the bottom electrode) 310 is designed to closely match the downward bulge of the top layer 320 to compensate the deformation of the top layer 320. As a result of this compensation, the effect of dynamic separation gap between the two electrodes are more uniform than it would be if both the bottom layer 310 and the top layer 320 have a flat shape when they are unbiased and static. Generally, the static gap separation is smaller at a location where a smaller deformation or displacement of the electrodes might occur.

Figure 3A:
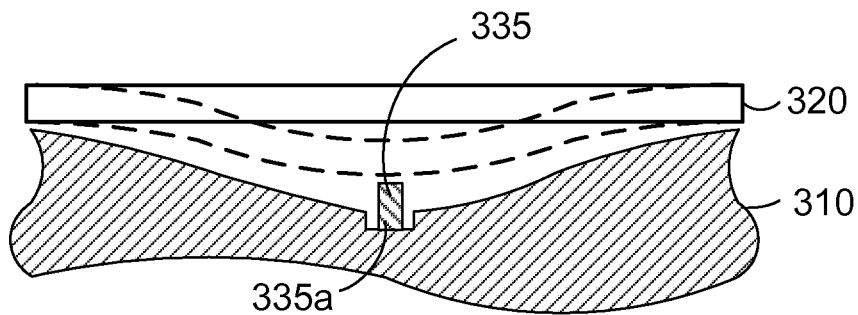
FIG. 3A shows the micro-electro-mechanical transducer of FIG. 3 having a motion stopper.

In order to improve insulation property and avoid electric shorting, a motion stopper may be disposed in the gap between the internal surfaces of the transducer. FIG. 3A shows the micro-electro-mechanical transducer of FIG. 3 having a motion stopper. The motion stopper 335 is disposed on the bottom layer 310 that is non-flat in the configuration shown, but may also be placed on the top layer 320. The motion stopper 335 desirably comprises an insulating material and in a preferred embodiment further includes an insulation extension 335a extending into the bottom layer 310 further enhance the insulation performance without increasing the separation gap between the two electrodes in the bottom layer 310 and the top layer 320.

Figure 4:
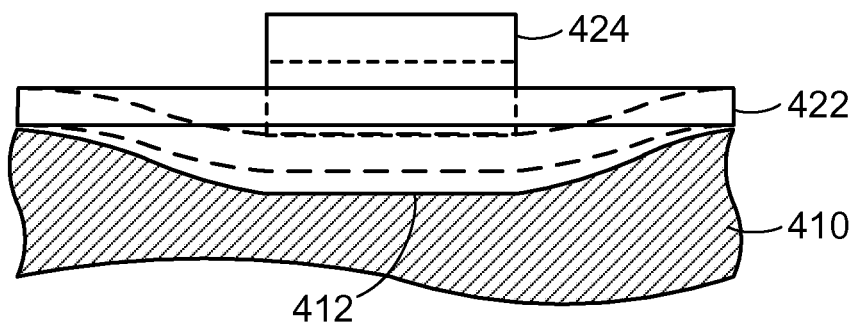
FIG. 4 shows a schematic view of another micro-electro-mechanical transducer having a non-flat electrode in accordance with the present invention.

FIG. 4 shows a schematic view of another micro-electro-mechanical transducer having a non-flat electrode in accordance with the present invention. The micro-electro-mechanical transducer in FIG. 4 is similar to that shown in FIGS. 2A-2B and 3. However, the micro-electro-mechanical transducer in FIG. 4 has a separate layer 424 which is placed on the top layer 422, and may serve as a top electrode. The separate layer 424 may be a part of the top electrode. In addition, the layer 424 covers only a central part of the top layer 422. In operation, the layer 424 moves (displaces) along with the top layer 422. In this configuration, although the top layer 422 may still deform in operation, the degree of deformation in the area covered by the layer 424 may be smaller than it is in the transducer of FIGS. 2A-2B and FIG. 3. Accordingly, the bottom layer 410 has a relatively flat central area 412 to match the smaller deformation of the top layer 422 and the layer 424. In this exemplary configuration, the wedge-like gap between the top layer 422 and the non-flat bottom layer 410 not only makes variable equivalent spring strength, but also increases the electrical field intensity between the two electrodes by enhancing the uniformity of the electrode gap. Alternatively, the top layer 424 may not be a part of the electrode. This design may have less parasitic capacitance, although it may also result in a weaker average electrical field in the transducing gap compared to that in FIG. 2A and FIG. 2B.

Figure 5:
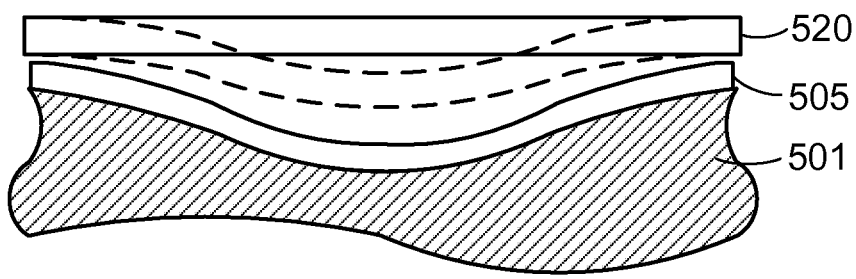
FIG. 5 shows a schematic view of another micro-electro-mechanical transducer having a non-flat electrode in accordance with the present invention.

FIG. 5 shows a schematic view of another micro-electro-mechanical transducer having a non-flat electrode in accordance with the present invention. The transducer in FIG. 5 is similar to that shown in FIGS. 2A-2B and 3. However, an insulation layer 505 is added on top of bottom layer (electrode) 501 to improve the insulation properties between bottom layer 501 and top layer (electrode) 520. In this case, the insulation layer 505 may be allowed to contact the top electrode 520 during transducer operation so that the transducer may have a variable spring strength as that shown in FIGS. 2A and 2B. Optionally, the insulation layer 505 may be added on the bottom surface of the top layer 520 instead.

It is appreciated that the wedge shapes shown above are merely for the purpose of illustration. In particular, the edges of the wedge-like gap between the two contacting layers may have various sizes with different curvatures, depending on the design requirements.

Generally, the height of the separation gap between the cMUT electrodes, especially for the high frequency cMUT, is relative small. The wedge-like gap shown above may be difficult to be fabricated using the general lithography and etching process. To overcome these difficulties, various novel methods are disclosed in this description for fabricating a desired shape on the surface with very small dimensions.

At the same time, instead of forming a shape having a continuous curvature, a simple step or multiple steps on one or both electrodes may be formed to have a leveled or multi-leveled surface. The higher level(s) on the surface may correspond to smaller deformation or displacement of the deformable electrode in the transducer, while lower levels may correspond to greater deformation or displacement. This simple approach still benefit from the advantage of increasing the average electrical field intensity in the electrode separation gap.

Figure 6A:
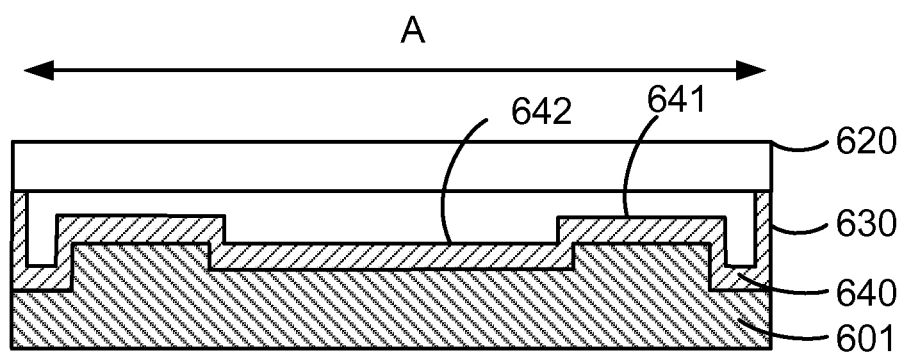
FIGS. 6A-6B show a schematic view of a micro-electro-mechanical transducer having a simple two-leveled electrode in accordance with the present invention.
Figure 6B:
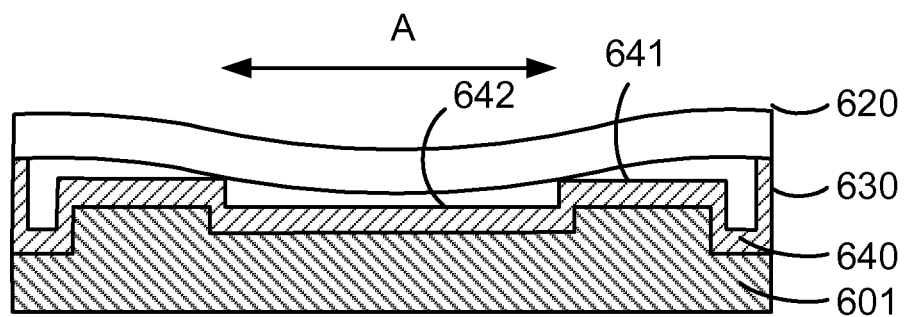

FIGS. 6A-6B show a schematic view of a micro-electromechanical transducer having a simple two-leveled internal surface in accordance with the present invention. The transducer in FIG. 6A has bottom layer 601 which may include the bottom electrode (not separately shown) and an insulation layer 640, and top layer 620 which may include a top electrode (not separately shown). Similar to other transducers shown herein, the bottom electrode may be provided by either using a conductive bottom layer 601 or using a separate conductive layer placed on a substrate, or a combination thereof. Likewise, the top electrode may be provided by either using a conductive top layer 620 or using a separate conductive layer included in the top layer 620, or a combination thereof. The top layer 620 is connected to the bottom layer 601 through supports 630. If both the top layer 620 and bottom layer 601 are electrodes, the supports 630 should preferably be made of an insulation material and further preferably include an insulation extension which extends below the adjacent surface of the bottom layer 601 to further improve the transducer performance.

The bottom layer 601 and the insulation layer 640 are characterized by a non-flat surface which has a simple stepped configuration. The insulation layer 640 is optional if the motion stop (not shown) is used in the transducer to prevent the electrical shorting. Specifically, the surface of the bottom layer 601 and the insulation layer 640 has level 641 and level 642 which is lower than level 641, forming a step. This stepped surface defines a nonuniform transducing gap between the two electrodes. As shown in FIG. 6B, at a certain level of deformation of the top layer 620, the top layer 620 contacts the level 641 to define a smaller area A of the spring membrane (a top layer 620 in this example), resulting in a greater spring strength. Unlike the case in FIGS. 2A and 2B where the spring strength is continuously variable within a range, the variable spring in FIGS. 6A and 6B has only two discrete levels of the spring strength. This configuration is perhaps the simplest embodiment of the general concept of using a non-flat electrode as shown above. Although a simple stepped configuration as shown in FIGS. 6A-6B may not provide optimal performance, it nevertheless has an advantage of simplicity in fabrication. In micro-electro-mechanical transducers, the transducing gap between the two electrodes tends to have a very small overall width, posing a challenge for fabricating a more refined non-flat surface of the electrode.

Figure 6C:
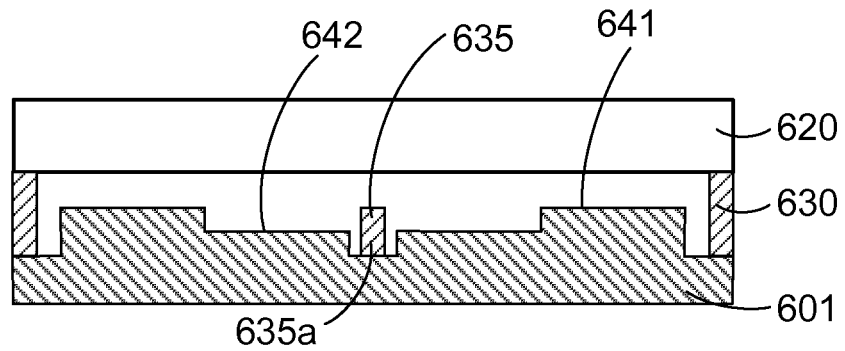
FIG. 6C shows the micro-electro-mechanical transducer of FIGS. 6A-6B having a motion stopper.

FIG. 6C shows the micro-electro-mechanical transducer of FIGS. 6A-6B having a motion stopper. The motion stopper 635 is disposed on the bottom layer 601 that is non-flat in the configuration shown (most specifically in the middle of the low-level 642), but may also be placed on the top layer 620. However, one or multiple motion stoppers with desired height may be placed in any location within electrode gap to achieve the same function. Preferably, the motion stopper(s) are placed in locations where the movable portion of the transducer is likely to experience maximum displacement. The motion stopper 635 desirably comprises an insulating material and in a preferred embodiment further includes an insulation extension 635a extending into the bottom layer 601 further enhance the insulation performance without increasing the separation gap between the two electrodes in the bottom layer 601 and the top layer 620.

Figure 7A:
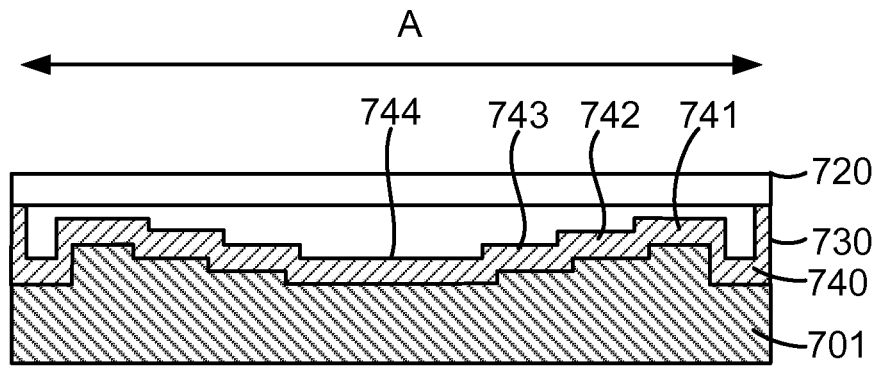
FIGS. 7A-7C show a schematic view of another micro-electro-mechanical transducer having a multi-leveled electrode in accordance with the present invention.
Figure 7B:
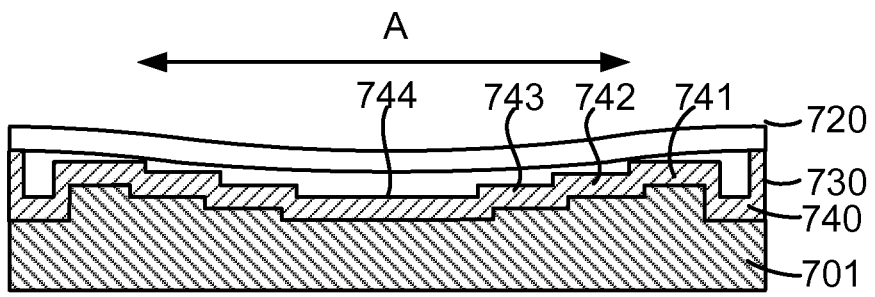
Figure 7C:
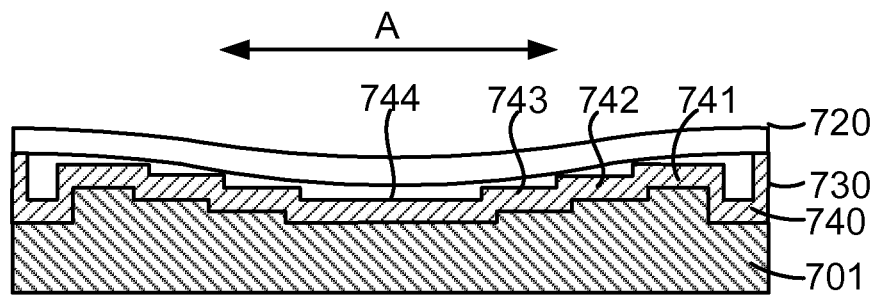

FIGS. 7A-7C show a schematic view of another micro-electro-mechanical transducer having a multi-leveled electrode in accordance with the present invention. The transducer in FIG. 7A has bottom layer 701 including the bottom electrode (not separately shown) and an insulation layer 740, and top layer 720 including a top electrode (not separately shown). The top layer 720 is connected to the bottom layer 701 through supports 730. The bottom layer 701 and the insulation layer 740 are characterized by a non-flat surface which has a multi-stepped configuration. Specifically, the surface of the bottom layer 701 and the insulation layer 740 has levels 741, 742, 743 and 744, forming several steps. This stepped surface defines a nonuniform transducing gap between the two electrodes. This is a more refined configuration compared to the simplest configuration shown in FIGS. 6A and 6B. As shown in FIG. 7B, at a certain level of deformation of the top layer 720, level 741 replaces supports 730 to define a smaller area A of the spring membrane (a top layer 720 in this example), resulting in a greater spring strength. At the next level of deformation, level 742 replaces level 741 to define an even smaller area A left the spring membrane to result in a still greater spring strength. Although the spring strength is still not continuously variable, the variable spring in FIGS. 7A-7C has three discrete levels of the spring strength, an improvement from the configuration shown in FIGS. 6A-6B. It is appreciated that as the number of levels increase, the property of the variable spring approaches that of a continuously variable spring. As described herein, the multi-stepped configuration in FIGS. 7A-7C may be fabricated using a similar method for fabricating the simple single-stepped configuration in FIGS. 6A-6B. As the number of levels increase, however, the complexity of the fabrication process also increases, gradually negating the simplicity advantage of this technique.

Figure 7D:
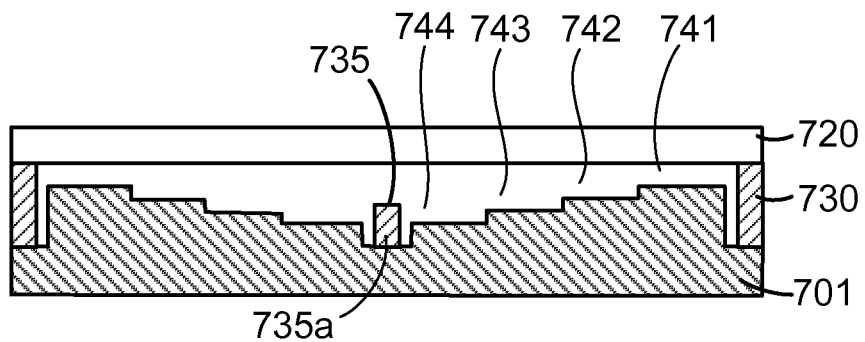
FIG. 7D shows the micro-electro-mechanical transducer of FIGS. 7A-7C having a motion stopper.

FIG. 7D shows the micro-electro-mechanical transducer of FIGS. 7A-7C having a motion stopper. The motion stopper 735 is disposed on the bottom layer 701 that is non-flat in the configuration shown (most specifically in the middle of the low-level 744), but may also be placed on the top layer 720. The motion stopper 735 desirably comprises an insulating material and in a preferred embodiment further includes an insulation extension 735a extending into the bottom layer 701 further enhance the insulation performance without increasing the separation gap between the two electrodes in the bottom layer 701 and the top layer 720.

Furthermore, it is appreciated that the steps shown in FIGS. 6A-6C and FIGS. 7A-7D may have rounded corners instead of sharp corners as shown. The fine features such as the corner shapes of the steps will depend on the fabrication process, particularly the type of technique used to form the steps. In general, oxidation methods as described herein result in rounder corners than many other methods.

If the gap height is reasonably large, the pattern on bottom electrodes shown in FIGS. 6A-6C and FIGS. 7A-7D may be formed by directly etching substrate with proper masks. If the gap height is too small, even a simple stepped surface may be difficult to be formed using a conventional etch process. In this case, other methods such as that using oxidation process or LOCOS-like processes described herein may need to be used to form the non-flat surface.

The methods in accordance with the present invention may not only be applied in conventional cMUT designs, but also advantageously in embedded-spring micromachined ultrasonic transducers (ESMUTs) as disclosed in the several patent applications referenced and incorporated herein. This combination takes advantage of the design flexibility and performance characteristics of the ESMUTs.

Figure 8:
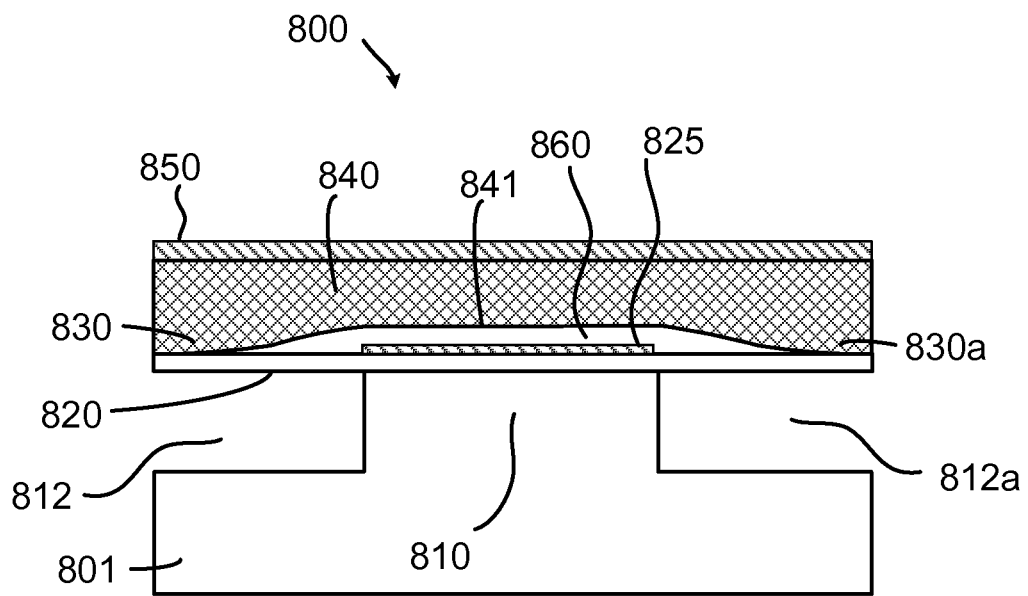
FIG. 8 shows an example of an embedded-spring cMUT having in non-flat internal surface in accordance with the present invention.

FIG. 8 shows an example of an embedded-spring cMUT having in non-flat internal surface in accordance with the present invention. FIG. 8 is an enlarged view of a selected portion 800 of an embedded spring micro-electro-mechanical transducer (ESMUT). The ESMUT portion 800 is a part of a complete ESMUT element (not shown). The structure of the selected ESMUT portion 800 provides a basis to understand the complete ESMUT element as described in the several PCT patent applications referenced herein.

For certain application such as an ESMUT with a high operation frequency, a full ESMUT element or device may use only one basic unit like ESMUT portion 800. For other applications, it may be preferred to use a combination of multiple basic units shown in FIG. 8.

The ESMUT portion 800 is built on a substrate 801, on top of which there is a standing feature (referred to as "anchor" hereinafter) 810 having two sidewalls on two opposing sides bordering cavities 812 and 812a, respectively. The standing feature (anchor) 810 may be an integrated part of the substrate 801 formed as a result of forming the cavities 812 and 812a, but may also be an additional structure added onto a separate substrate. In one embodiment, for example, the anchor 810 is part of the middle spring layer 820. The substrate of 801 may be made of either a nonconductive material or a conductive material such as silicon or polysilicon. In a configuration where the anchor 810 is a separate structure, conductivity of the anchor 810 may be the same as or different from that of the substrate 801. For example, the substrate 801 may be made of a nonconductive material while the anchor 810 a conductive material such as metal, silicon or polysilicon.

The ESMUT portion 800 shown has two cavities 812 and 812a long the opposing sides of anchor 810. Depending on how and where the ESMUT portion 800 is taken from the ESMUT element, the second cavity 812a may either belong to a different and separate cavity, or just another portion of a same circular or extended cavity as the first cavity 812.

The ESMUT portion 800 further has these components: (a) a middle spring layer 820, preferably an elastic membrane, placed on a top side of the anchor 810; (b) a bottom electrode 825 placed on the middle spring layer 820; (d) a top plate 840 connected to the middle spring layer 820 through connection areas 830 and 830a; and (e) a top electrode 850.

The ESMUT 800 in FIG. 8 is characterized in that the bottom side of the top plate 840 has a non-flat shape having a concave middle area 841 above the bottom electrode 825 and protruding connection areas 830 and 830a. The top plate 840 is connected to the middle spring layer 820 through the protruding connection areas 830 and 830a which separate the concave middle area 841 of the top plate 840 from the bottom electrode 825. The protruding connection areas 830 and 830a each has a graduated surface facilitating the variable contact area between the connection areas 830/830a and the middle spring layer 820 depending on the degree of displacement of the top plate 840 and the deformation of the middle spring layer 820. In general, the larger at the displacement and the deformation, the greater the contact area is, thus resulting in a variable spring model. As will be shown in FIG. 9 below, the non-flat surface may also be deployed on other surfaces such as the anchor 810.

As shown in FIG. 8, the bottom side of the top plate 840 faces the top side of the middle spring layer 820, and the bottom side of the middle spring layer 820 faces the front side of the substrate wafer, whereby the protruding connection areas 830/830a define a transducing space 860 below the top plate 840. The transducing space 860 is generally defined between the top plate layer 840 and the top surface of the middle spring layer 820 or the top surface of the anchor 810, whichever is higher. Where there is an intervening layer between the top plate layer 840 and the top surface of the middle spring layer 820 or the top surface of the anchor 810, the available transducing space may be reduced. For example, if another layer (such as an insulation layer, not shown) is deposited over the middle spring layer 820 or the anchor 810, the top surface of the anchor is defined as the uncovered surface of the additional layer deposited over the anchor 810.

Depending on how and where the ESMUT portion 800 is taken from the ESMUT element 800, the connecting areas 830 and 830a may each be a part of two different and separate connectors, or just different portions of a same circular or extended connecting area.

The top plate 840 may be adapted to serve as a surface plate of the transducer to interface with a medium. Because the top plate 840 is connected to the spring layer 820, it generally contributes mass to the equivalent spring system and therefore can be treated as a mass layer. In the above embodiment shown, the top plate 840 also includes or carries a top electrode 850. However, in some other embodiments of the present invention, the top plate 840 may serve as a mass layer only without including or carrying an electrode, as disclosed in International Application (PCT), entitled MICRO-ELECTRO-MECHANICAL TRANSDUCER HAVING A SURFACE PLATE, filed on even date with the present application by a common applicant, which patent application is fully incorporated herein by reference.

Figure 9:
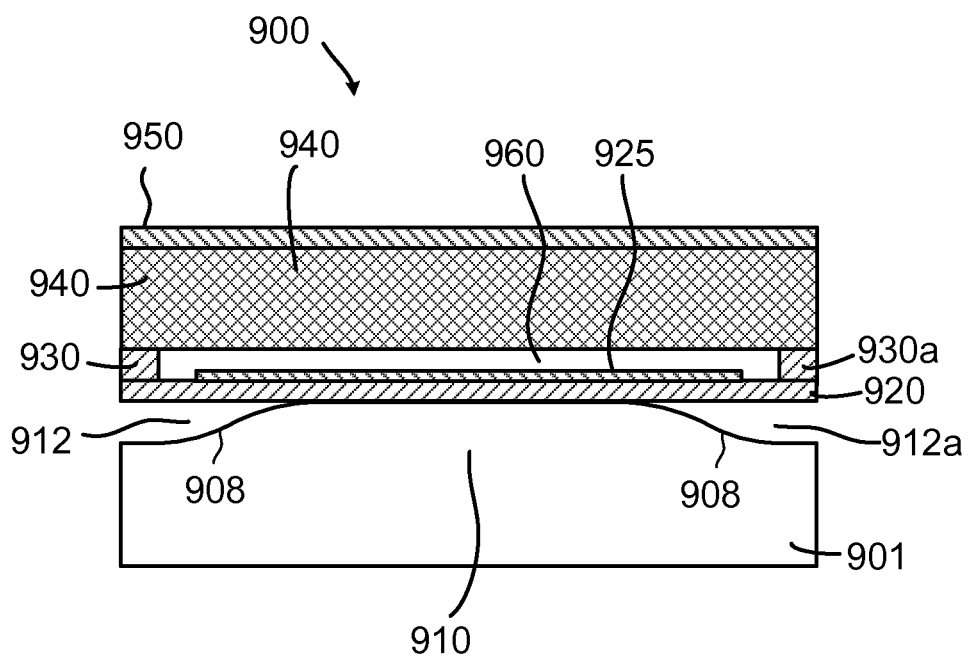
FIG. 9 shows another example of an embedded-spring cMUT having in non-flat internal surface in accordance with the present invention.

FIG. 9 shows another example of an embedded-spring cMUT having in non-flat internal surface in accordance with the present invention. Similar to FIG. 8, FIG. 9 is an enlarged view of a selected portion 900 of an embedded spring micro-electro-mechanical transducer (ESMUT). The ESMUT portion 900 is built on a substrate 901, on top of which there is an anchor 910 having two sidewalls on two opposing sides bordering cavities 912 and 912a, respectively. The anchor 910 may be an integrated part of the substrate 901 formed as a result of forming the cavities 912 and 912a, but may also be an additional structure added onto a separate substrate.

The ESMUT structure portion 900 further has these components: (a) a middle spring layer 920, preferably an elastic membrane, which is placed on a top side of the anchor 910; (b) a bottom electrode 925 placed on the middle spring layer 920; (d) a top plate 940 connected to the middle spring layer 920 through connectors 930 and 930a; and (e) a top electrode 950.

The top plate 940 is connected to the middle spring layer 920 through the connectors 930 and 930a which separate the top plate 940 from the bottom electrode 925 and the spring layer 920. As shown in FIG. 9, the bottom side of the top plate 940 faces the top side of the middle spring layer 920, and the bottom side of the middle spring layer 920 faces the front side of the substrate wafer, whereby the connectors 930/930a define a transducing space 960 below the top plate 940.

The ESMUT 900 in FIG. 9 is characterized in that the anchor 910 has sloped shoulders 908 and 908a each having a graduate surface to form wedge-shaped openings 912 and 912a between the anchor 910 and the spring layer 920. This structure makes a variable contact area between the sloped shoulders 908/908a of the anchor 910 and the middle spring layer 920, depending on the degree of displacement of the top plate 940 and the deformation of the middle spring layer 920. In general, the larger displacement and the deformation are, the greater the contact area is, thus resulting in a variable spring model.

As shown in FIG. 9 above, the non-flat surface may also be deployed on other surfaces such the bottom of the top plate or the spring layer. In principle, the non-flat surface may also be deployed on the spring layer (820 in FIG. 8 or 920 in FIG. 9) to achieve the similar variable spring results as shown in FIG. 10.

Figure 10:
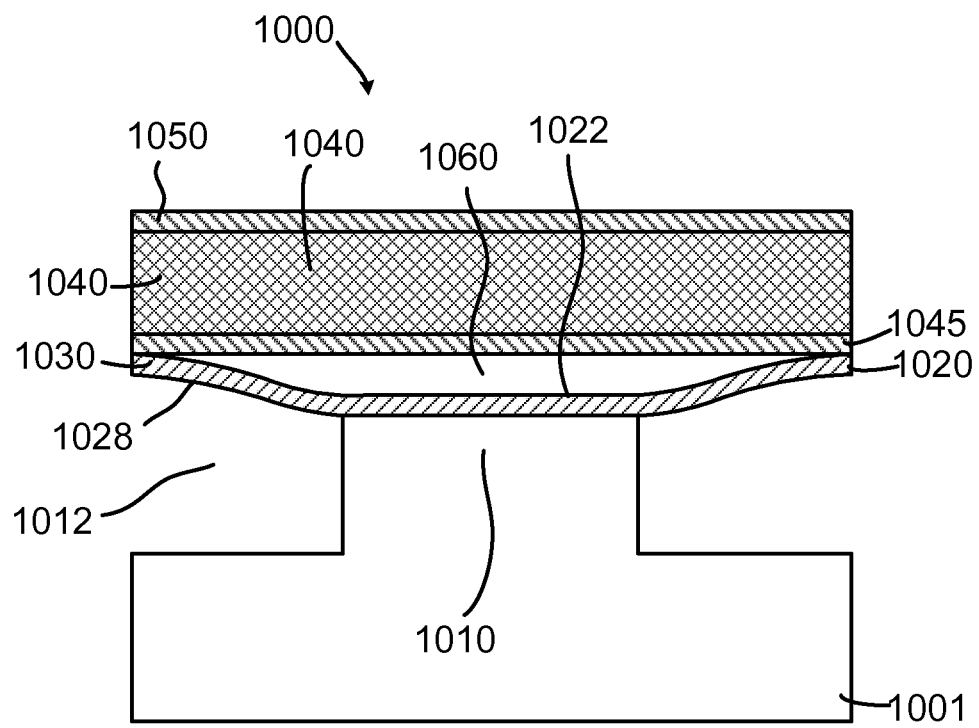
FIG. 10 shows another example of an embedded-spring cMUT having in non-flat internal surface in accordance with the present invention.

FIG. 10 shows another example of an embedded-spring cMUT having in non-flat internal surface in accordance with the present invention. Similar to FIGS. 8-9, FIG. 10 is an enlarged view of a selected portion 1000 of an embedded spring micro-electro-mechanical transducer (ESMUT). The ESMUT portion 1000 is built on a substrate 1001, on top of which is an anchor 1010 defining cavity 1012. The anchor 1010 may be an integrated part of the substrate 1001, but may also be an additional structure added onto a separate substrate.

The ESMUT structure portion 1000 is characterized by a non-flat middle spring layer 1020 which has raised (protruding) end portions 1030 to substitute connectors 930 in FIG. 9. The ESMUT structure portion 1000 further has these components: (a) a bottom electrode 1022 which is either a separate layer placed on the middle spring layer 1020 or a part of a conductive middle spring layer 1020; (b) a top plate 1040 connected to the middle spring layer 1020 through the raised end portions of the middle spring layer 1020; (c) an insulation layer 1045 under the top plate 1040; and (e) a top electrode 1050. Alternatively, the insulation layer 1045 may be placed on top of the curved middle spring layer 1020 and conforms to the curved shape thereof.

As shown, the raised end portions 1030 of the middle spring layer 1020 each has a curved top surface contacting the top plate 1040 (through the insulation layer 1045 in the example shown). As the flexible middle spring layer 1020 deforms, it makes a variable contact with the top plate 1040. This design therefore also effectuates a variable spring model. However, the configurations shown in FIGS. 8 and 9 may be more preferred than the consideration in FIG. 10 because it may be more difficult to fabricate a very thin non-flat spring layer and also less desirable to have stress in the thin spring layer. Nevertheless, such a design is within the spirit of the present invention.

It is appreciated that instead of using a continued curved or sloped spring contact surface as shown in FIGS. 8-10, a single or multiple leveled surfaces shown in FIGS. 6A-6B and FIGS. 7A-7C may be used to achieve a similar function.

One benefit of using the above illustrated curved wedge-shaped contact surface is that, depending on the design parameters, it may make motion stoppers unnecessary. In general, motion stoppers between the spring layer and the substrate may be needed to limit the maximum displacement in order to avoid potential shorting. In the designs of the present invention shown in FIGS. 8-9, however, the displacement of the surface plate (840 and 940) may be inherently limited. Because an increase of such displacement increases the contact area between the spring and the contacting substrate, the effective length of the spring is decreased with an increase of the displacement. As a result, the effective spring constant in this new design will increase with the displacement. Depending on design requirements, an insulation layer (not shown) may be or may be not needed.

The exact manner the effective spring constant will increase with the displacement and/or deformation depends on the curved shape of the non-flat surface (e.g., the surfaces of the shoulders 908 underneath the spring layer 920). Various methods, such as using oxidation, LOCOS-like process, thermal reflow, annealing, or well controlled patterning process, are described below and may also used to make a desired curved shape on a contacting surface.

Applications of the present invention in cMUT with embedded strings have distinctive advantages over applications of the present invention in conventional cMUT with a flexible membrane. Beside of the inherent drawbacks for the conventional cMUTs with a flexible membrane surface, there are some additional difficulties in accomplishing a variable spring constant in the conventional cMUT. First, a thick enough insulation layer is needed to prevent the device from the electrical shorting or breakdown. This is usually undesirable because a device with the thick insulation layer usually has charging and hysteresis problems which degrade the transducer reliability performance. The parasitic capacitance increases when there is a larger contact area. The active area of the transducer surface may also decrease. Furthermore, a thick insulation layer also degrades the device performance because the minimum electrode gap height is limited by the thickness of the insulation layer. More minor issues such as relative large non-uniform electrical field and displacement may also be a concern. The designs in FIG. 4 may solve the parasitic problem, but with a trade-off in transduction performance.

Equally important, because the spring, mass and electrodes of the conventional cMUTs (cMUTs with a flexible membrane) are dependent on each other, the device lacks design flexibility to solve all above-mentioned problems. For this reason, although the present invention may be used in all kinds of cMUTs, it may be more advantageously used in cMUTs with embedded strings as described herein and in several other applications reference and incorporated herein.

Fabrication Methods:

The micro-electro-mechanical transducer in accordance with the present invention may be fabricated using a variety of methods. As discussed above, for relatively simple shapes such as a single stepped are multiple stepped surface involving a reasonably large transducing gap, conventional photo-lithography techniques may be used. However, to form more refined shapes, a number of new methods as described below may be advantageous.

Figure 11A:
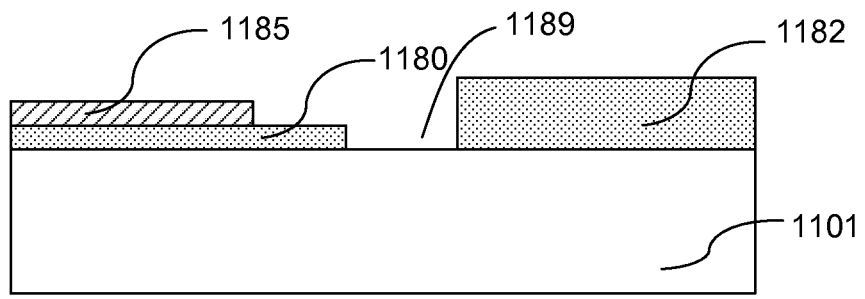
FIGS. 11A-11C show a fabrication process for making a recess or recesses of a desired shape on an oxidizable substrate using oxidation and diffusion barriers.
Figure 11B:
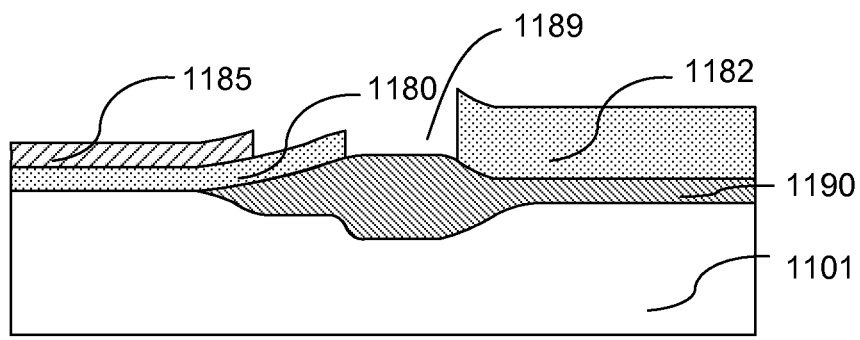
Figure 11C:
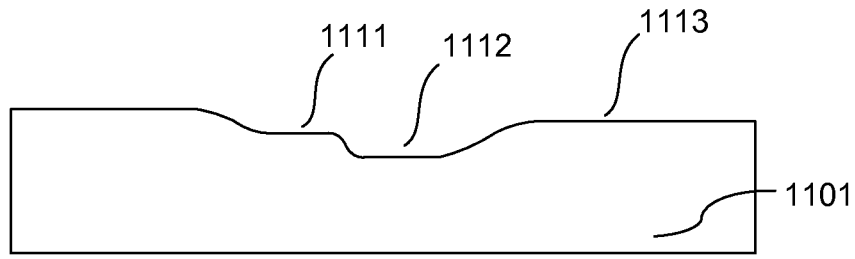
Figure 12A:
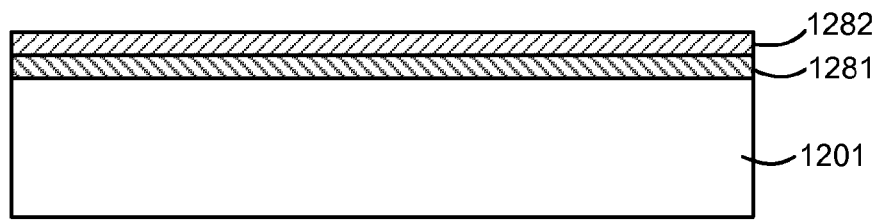
FIGS. 12A-12D show an example of fabrication process for making a recess or recesses having a continuous shape and at least one wedge-like shoulder portion using oxidation and diffusion barriers.
Figure 12B:
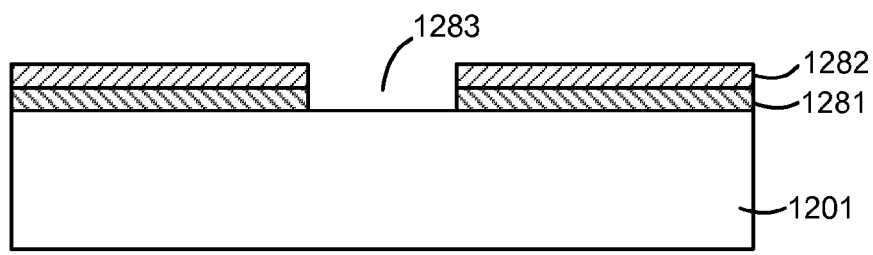
Figure 12C:
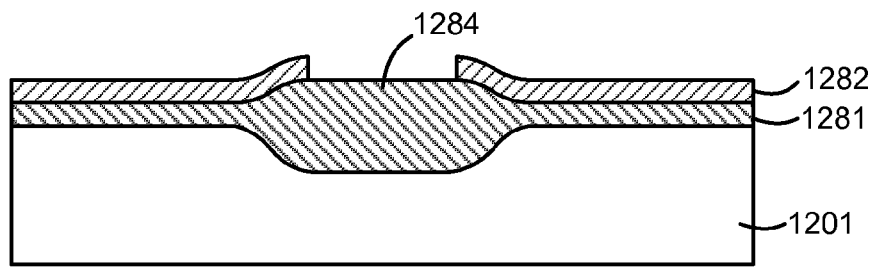
Figure 12D:
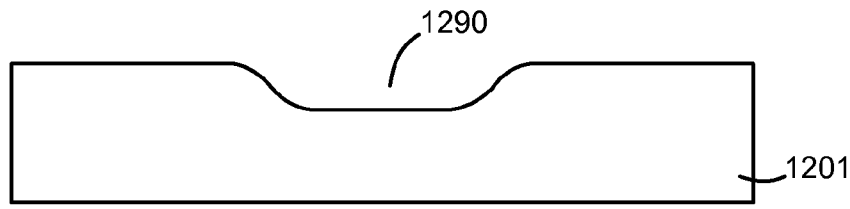
Figure 13A:
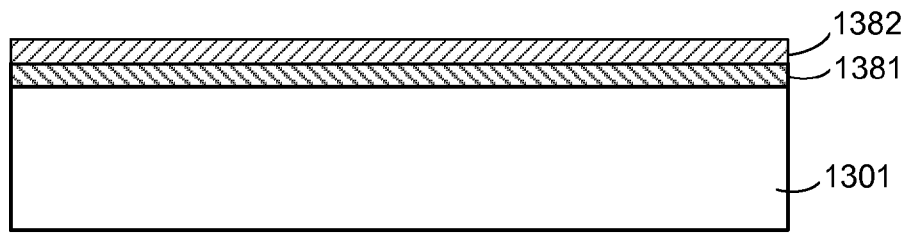
FIGS. 13A-13D show another example of fabrication process for making a recess or recesses having a continuous shape and at least one wedge-like shoulder portion using oxidation and diffusion barriers.
Figure 13B:
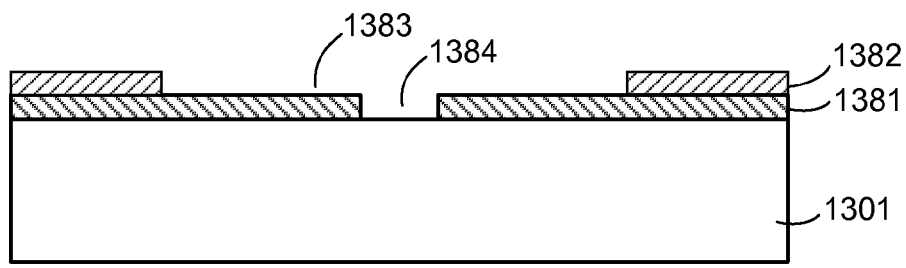
Figure 13C:
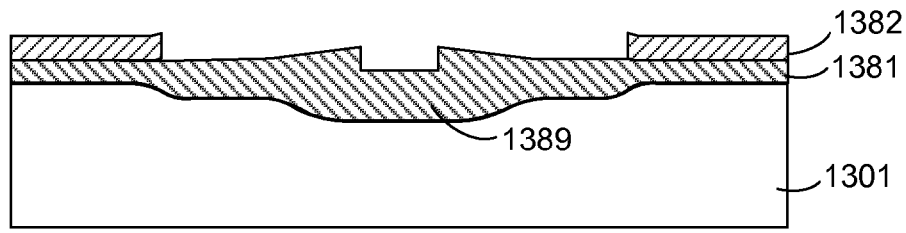
Figure 13D:
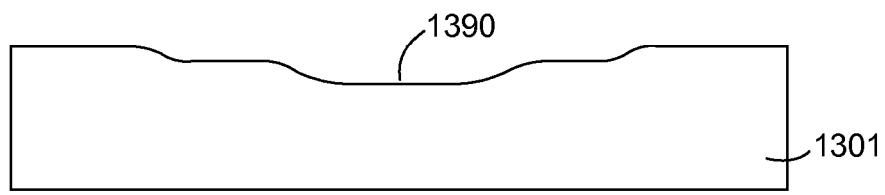

FIGS. 11A-11C show a fabrication process for making a recess or recesses of a desired shape on an oxidizable substrate using oxidation and diffusion barriers. This fabrication process illustrates general aspects of an exemplary method that can be used for creating a recess or recesses of a desired shape as part of a complete process in fabricating the micro-electro-mechanical transducer in accordance with the present invention. The method is particularly suitable for forming a recess on an oxidizable substrate such as silicon substrate. For example, process can also be used to form a recess on an oxidizable top plate layer. The steps of the fabrication process are described below.

In step one (FIG. 11A), a layer or layers of diffusion barriers 1180, 1182 and 1185 are grown or deposited on substrate 1101. The layers of diffusion barriers 1180, 1182 and 1185 are patterned according to a desired shape of the recess that needs to be made on the substrate 1101. In the example shown, the diffusion barriers 1180 and 1182 are material(s) that can partially block the gas (such as oxygen and hydrogen) diffusion in the next step, while the diffusion barrier 1185 is a material that can completely or nearly completely block gas diffusion in the next step. An exemplary material for diffusion barrier 1180 or 1182 is an oxide which can partially stop or reduce further oxidation. An exemplary material for diffusion barrier 1185 is a nitride which can essentially stop oxidation therethrough. The exemplary pattern formed has an opening 1189 with the substrate uncovered by the diffusion barriers.

In step two (FIG. 11B), a thermal oxidation process is performed over the diffusion barriers 1180, 1182 and 1185 (including the opening 1189) to form an oxide layer 1190. The resultant oxide layer reaches different depths at different sites. The oxidation depth is greatest underneath the opening 1189 because the oxidation is not deterred in that area. The oxidation depth is the second greatest through the area of diffusion barrier 1180 uncovered by the diffusion barrier 1185 because the diffusion barrier 1185 only partially stops oxidation and is thinner. The oxidation depth is yet smaller through the area of diffusion 1182 because it is a relatively thick layer of material partially stops oxidation. The oxidation depth in the area covered by the diffusion barrier 1185 is close to zero because the diffusion barrier 1185 essentially stops further oxidation in that area. The depths of the oxide layer will be the basis for forming a recess of a desired shape in the next step.

In step three (FIG. 11C), the diffusion barrier layers 1180, 1182, and 1185 and the oxide layer 1190 are removed to form a recess of a shape having various depths 1111, 1112 and 1113.

The above process is an illustration of the basic aspects of the method. Various combinations of diffusion barriers, patterning, sizes and thicknesses may be used to achieve a desired shape for a recess on the substrate. The above method may also be repeated or combined to form more complex recess patterns with various depths. Described in the following are several exemplary processes used for fabricating a recess or recesses having a continuous shape with at least one wedge-like shoulder portion.

FIGS. 12A-12D show an example of fabrication process for making a recess or recesses having a continuous shape and at least one wedge-like shoulder portion using oxidation and diffusion barriers. The steps of the process are described below.

In step one (FIG. 12A), an oxide layer 1281 of a desired thickness and a nitride layer 1282 are formed on substrate 1201.

In step two (FIG. 12B), the oxide layer 1281 and the nitride layer 1282 are patterned. In the example shown, the opening 1283 is made through the oxide layer 1281 and nitride layer 1282 to have the substrate in the opening uncovered.

In step three (FIG. 12C), an oxidation process is performed over the substrate 1201 and the oxide and nitride pattern. Due to the effect of the oxide layer 1281 and the nitride layer 1282 as diffusion barriers, the new oxide layer 1284 reaches different depths in the substrate 1201 at different locations to form a shape profile.

In step four (FIG. 12D), the nitride layer 1282 and the oxides 1281 and 1284 are removed to form a recess 1290 which has a continuous shape and wedge-like shoulder portions as shown.

FIGS. 13A-13D show another example of fabrication process for making a recess or recesses having a continuous shape and at least one wedge-like shoulder portion using oxidation and diffusion barriers. The steps of the process are described below.

In step one (FIG. 13A), an oxide layer 1381 of a desired thickness and a nitride layer 1382 are formed on substrate 1301.

In step two (FIG. 13B), both the oxide layer 1381 and the nitride layer 1382 are patterned. In the example shown, an opening 1383 is made through the nitride layer 1382, and in opening 1384 is made through the oxide layer 1381. The openings 1383 and 1384 have different sizes to control a desired aspect of the shape of the recess to be formed.

In step three (FIG. 13C), an oxidation process is performed over the substrate 1301, the oxide and the nitride patterns. Due to the effect of the oxide layer 1381 as a partial diffusion barrier and the nitride layer 1382 as a total diffusion barrier, the new oxide layer 1389 reaches different depths in the substrate 1301 at different locations to form a shape profile.

In step four (FIG. 13D), the nitride layer 1382 and the oxides 1381 and 1389 are removed to form a recess 1390 which has a continuous shape and wedge-like shoulder portions as shown.

As shown above, the size and shape of the recess formed using the above techniques are controlled by designing a particular pattern in combination of the diffusion barriers such as nitride and oxide. Some shapes may be achieved using a single diffusion barrier only. The above process therefore can be modified in many ways either to simplify the process or to further refine the shape of the final recess formed. In general, multiple layers of diffusion barriers and most sophisticated patterning allow more control and refinement of the process and the shape of the recess formed.

Following the concept demonstrated, sophisticated patterning may be designed to achieve a sophisticated shape of the recess, as further illustrated below.

FIGS. 14A-14E show another example of fabrication process for making a recess or recesses having a continuous shape with a controlled curvature using oxidation and diffusion barriers. The steps of the process are described below.

In step one (FIG. 14A), an oxide layer 1481 of a desired thickness and a nitride layer 1482 are formed on substrate 1401.

Figure 14A:
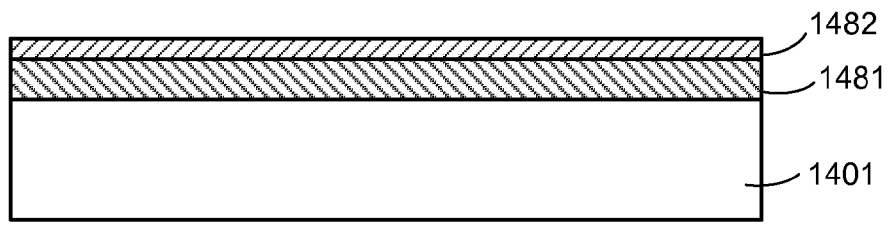
FIGS. 14A-14E show another example of fabrication process for making a recess or recesses having a continuous shape with a controlled curvature using oxidation and diffusion barriers.
Figure 14B:
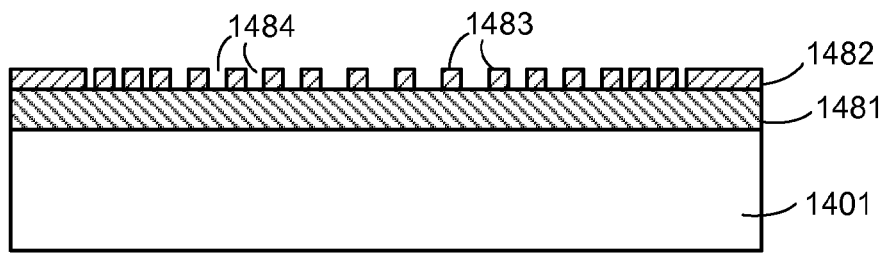
Figure 14C:
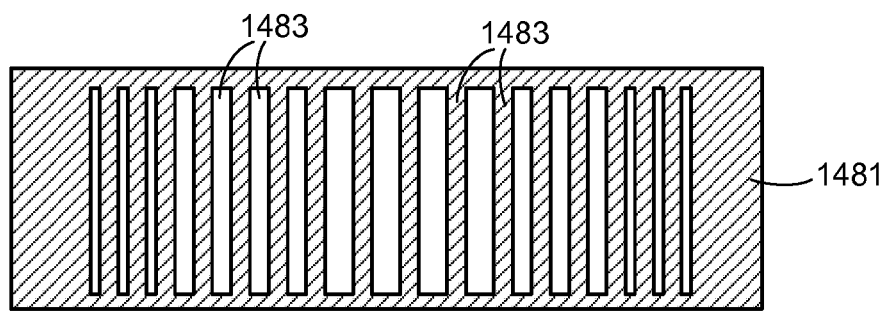
Figure 14D:
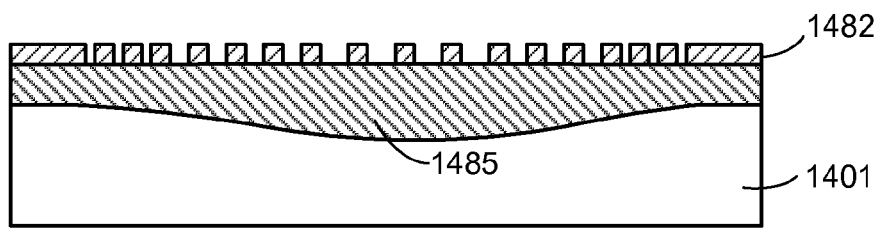
Figure 14E:
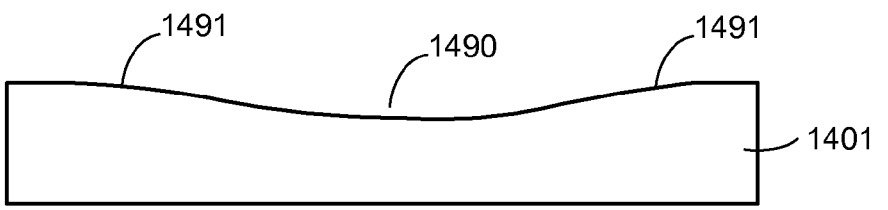
Figure 15A:
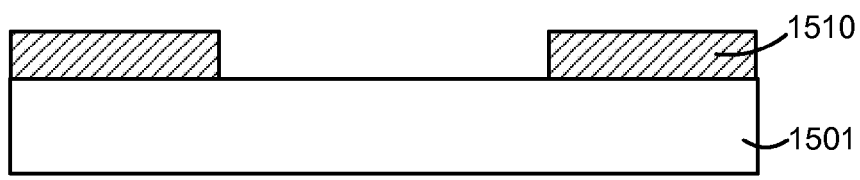
FIGS. 15A-15G show an exemplary fabrication process for making a micro-electro-mechanical transducer having a stepped surface.
Figure 15B:
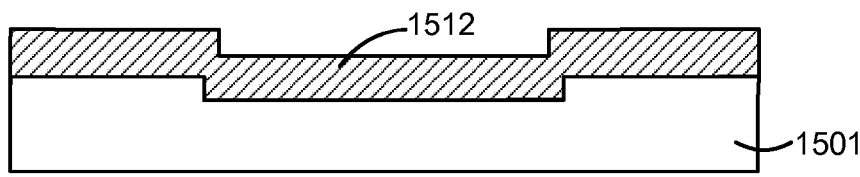
Figure 15C:
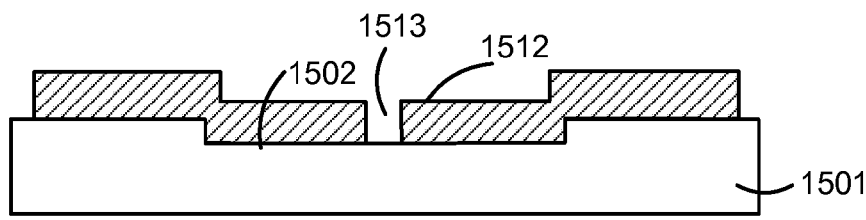
Figure 15D:
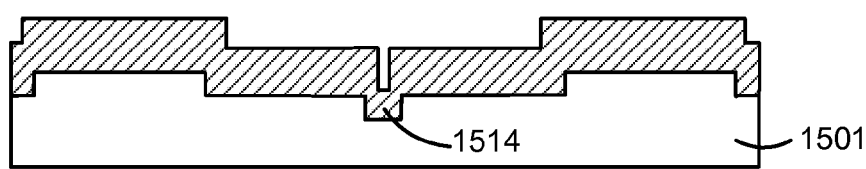
Figure 15E:
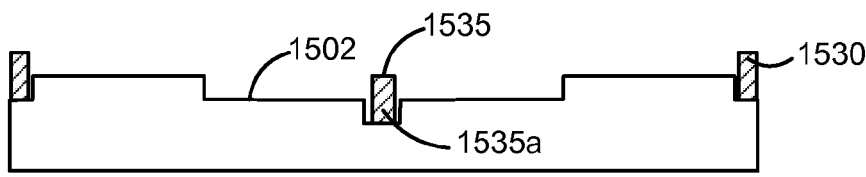
Figure 15F:
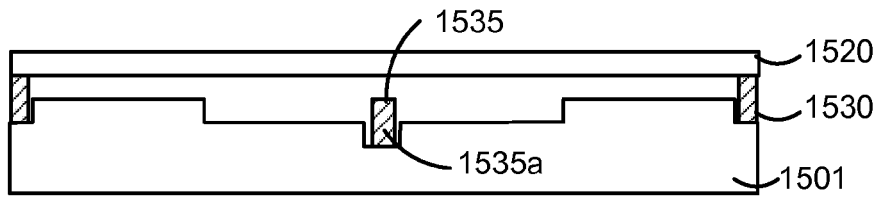
Figure 15G:
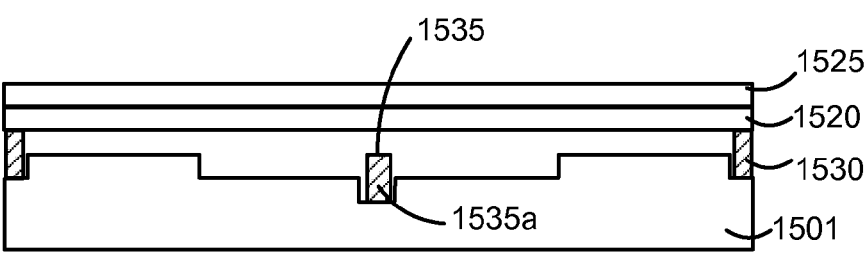
Figure 16A:
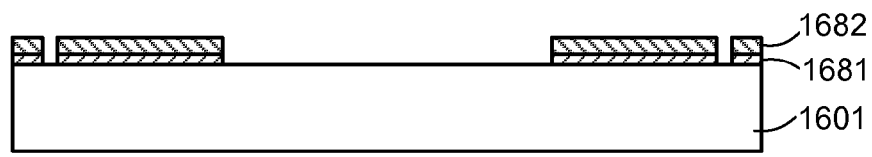
FIGS. 16A-16G show another exemplary fabrication process for making a micro-electro-mechanical transducer having a stepped surface.
Figure 16B:
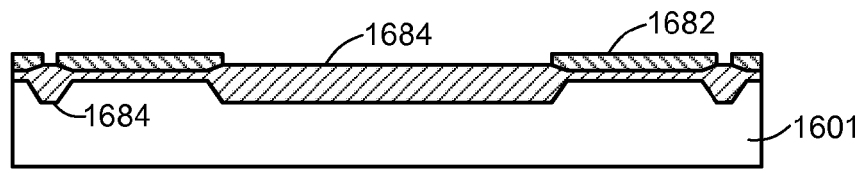
Figure 16C:
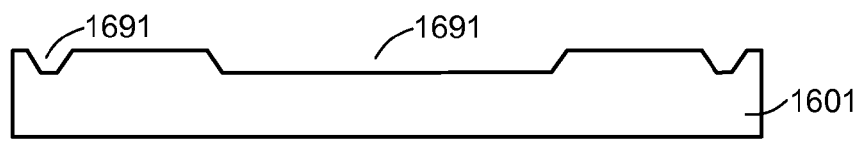
Figure 16D:
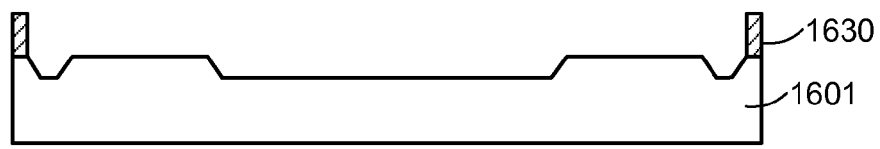
Figure 16E:
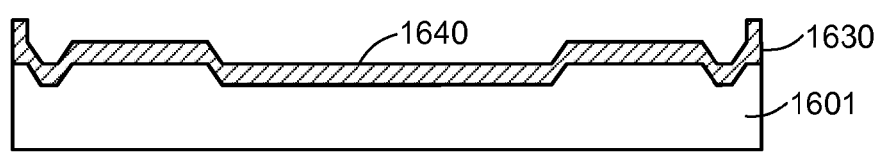
Figure 16F:
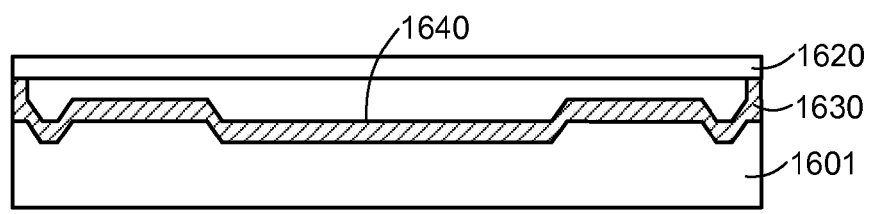
Figure 16G:
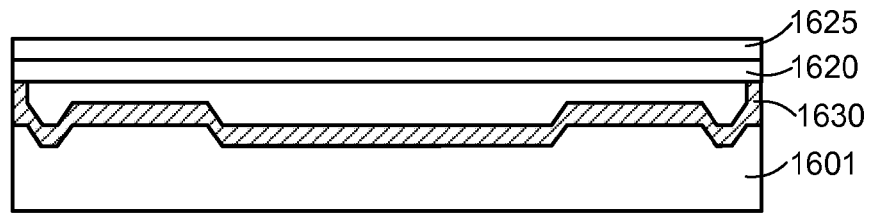
Figure 17A:
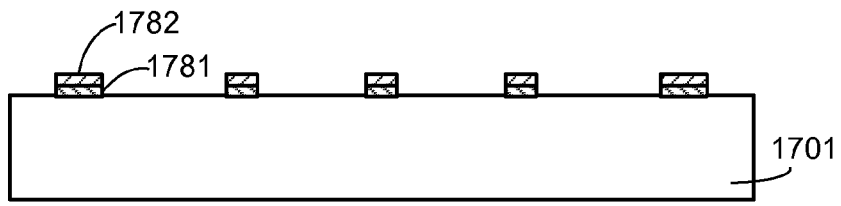
FIGS. 17A-17E show an exemplary fabrication process to make localized non-flat areas to effectuate a variable spring model without affecting other areas of the electrodes.
Figure 17B:
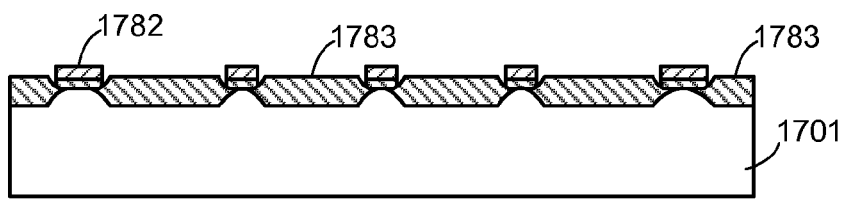
Figure 17C:
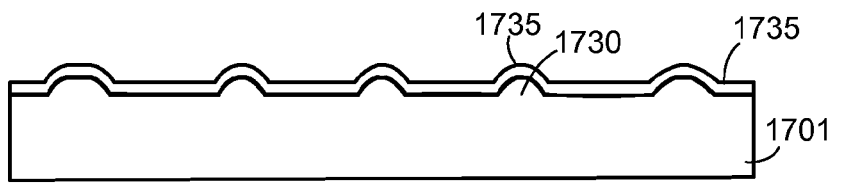
Figure 17D:
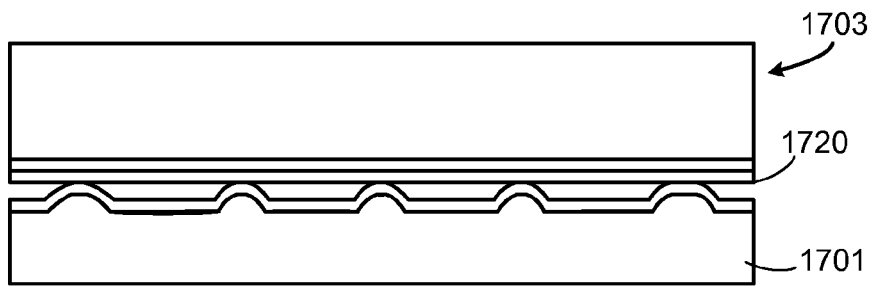
Figure 17E:
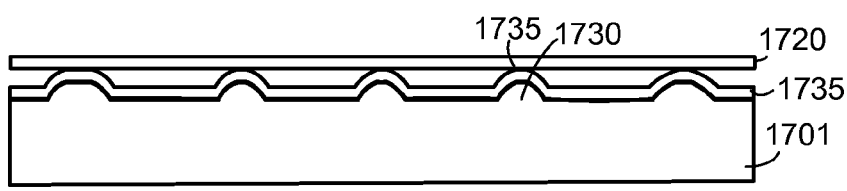
Figure 18A:
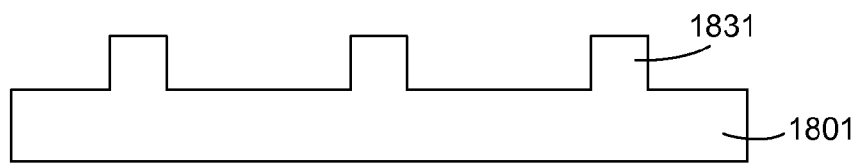
FIGS. 18A-18F show an alternative fabrication process to make localized non-flat areas to effectuate a variable spring model without affecting other areas of the electrodes.
Figure 18B:
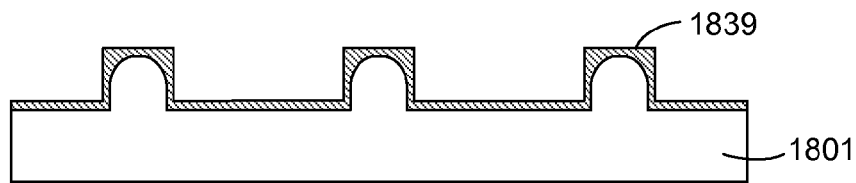
Figure 18C:
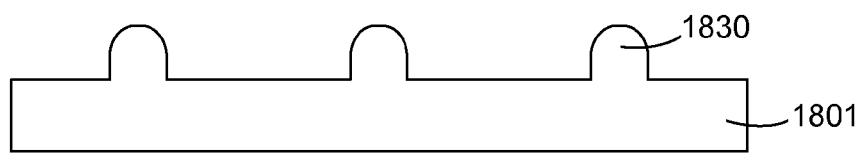
Figure 18D:
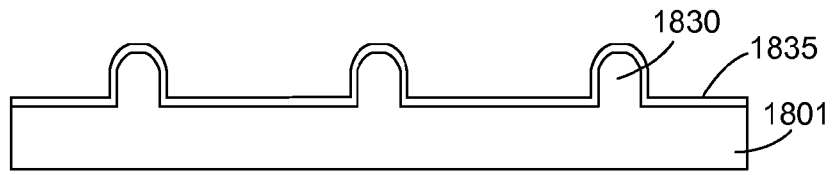
Figure 18E:
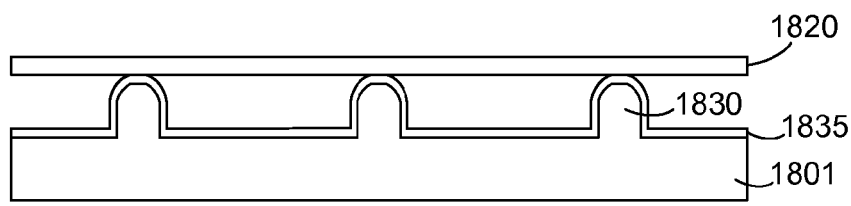
Figure 18F:
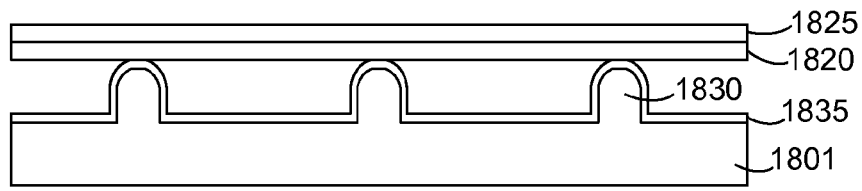

In step two (FIG. 14B and FIG. 14C), the nitride layer 1482 is patterned. In the example shown, a plurality of openings 1484 are made through the nitride layer 1482. The plurality of openings 1484 are separated by islands 1483. FIG. 14B shows a cross-sectional view of the nitride pattern having the plurality of openings 1484. FIG. 14C shows a top view of the same nitride pattern. In the example shown, the size of each individual opening 1484 and the distribution density of the openings 1484 are carefully designed to achieve a particular shape of the recess to be made. In general, the size and/or the density of the openings 1484 are greater at locations where a greater depth of the recess is to be formed. The profile of the size and density of the openings 1483 can be designed to achieve precise control of the shape of the recess to be formed.

In step three (FIG. 14D), an oxidation process is performed over the substrate 1401, the patterns of the nitride layer 1482 and the oxide layer 1481. Due to the effect of the oxide layer 1481 as a partial diffusion barrier and the nitride layer 1482 as a total diffusion barrier, and also due to the modulation effect of the nitride pattern, the new oxide layer 1485 reaches different depths in the substrate 1401 at different locations to form a shape profile.

In step four (FIG. 14E), the nitride layer 1482, the oxide layer 1481, and the oxide layer 1485 are removed to form a recess 1490 which has a continuous shape with a control the curvature as shown. In the example shown, the recess 1490 has two gradually curved shoulder portions 1491.

The above methods, and other methods described below, in addition to the conventional techniques such as photolithography, may be used in various combinations to fabricate a micro-electro-mechanical transducer in accordance with the present invention. It is appreciated that these methods may be used to create a desired shape on a surface of various components in a micro-electro-mechanical transducer. For example, the above method illustrated in FIGS. 14A-14E may be applied on a bottom layer having a bottom electrode to form a shaped (non-flat) bottom electrode. A membrane layer having a top electrode may be subsequently placed on the top of the shaped bottom electrode to form a micro-electro-mechanical transducer in accordance with the present invention. The membrane layer may be placed directly on the gradually sloped shoulders 1491 to form a variable spring model.

The methods may also be used to form stepped surfaces in a micro-electro-mechanical transducer (such as that shown in FIGS. 6-7). Examples are shown below.

FIGS. 15A-15G show an exemplary fabrication process for making a micro-electro-mechanical transducer having a stepped surface. The steps of the process are described below.

In step one (FIG. 15A), a thermal oxide 1510 is formed and patterned on substrate 1501.

In step two (FIG. 15B), another layer of thermal oxide 1512 is formed over the pattern of thermal oxide 1510. Because the first thermal oxide 1510 functions as a partial diffusion barrier to further oxidation, the thermal oxide 1512 reaches different depths at different areas according to the pattern of the thermal oxide 1510. As shown in the next step, this will result in a stepped surface on the substrate 1501.

In step three (FIG. 15C), the thermal oxide layer 1512 is patterned to form an opening 1513 in preparation for forming a motion stopper with an insulation extension. For fabricating a transducer that does not have a motion stopper, this step and the subsequent related aspects or steps of the procedure are optional.

In step four (FIG. 15E), yet another oxide layer 1514 is formed. Due to the removal of the diffusion barrier (the oxide layer 1512) in the area of the opening 1513, the oxide layer 1514 reaches deeper into the substrate 1501. This prepares for forming of a motion stopper with an insulation extension in the following steps.

In step five (FIG. 15E), the thermal oxides (1510, 1512 and 1514) are patterned and partially removed to form anchors 1530 and motion stopper 1535 but leave the rest of the substrate uncovered. If needed, anchors 1530 and motion stopper 1535 can also be formed from a new grown oxide after completely removing the thermal oxide 1510 and 1512. In the particular example shown, the motion stopper 1535 and the anchor 1530 both have an insulation extension (e.g., 1535a with the motion stopper 1535) extending further into the substrate 1501 to enhance the insulation without increasing the electrode gap. Due to the different depths reached by the second oxide 1512, the surface of the substrate 1502 has a stepped feature as shown.

In this step, an optional insulation layer (not shown) may be formed over the stepped surface of the substrate 1501 with the resultant surface maintains the stepped feature. The insulation layer is optional, especially when a motion stopper 1535 with an insulation extension 1535a has been formed.

In step six (FIG. 15F), a membrane layer 1520 is formed over the anchors 1530 and motion stopper 1535. This may be done in a variety of ways. For example, an SOI wafer carrying a desired membrane layer may be bonded to the substrate 1501 over the anchors 1530 and be etched back to leave the membrane layer 1520 on the substrate 1501.

In step seven (FIG. 15G), the metal layer 1525 is deposited and patterned to form a top electrode. If the membrane layer 1520 is conductive, it may serve as an electrode thus requiring no further deposition of the metal layer 1525. After this, the top layers including the membrane layer 1520 are etched through to separate individual cMUT elements.

FIGS. 16A-16G show another exemplary fabrication process for making a micro-electro-mechanical transducer having a stepped surface. The steps of the process are described below.

In step one (FIG. 16A), a thermal oxide 1681 and nitride 1682 are formed and patterned on substrate 1601.

In step two (FIG. 16B), another layer of thermal oxide 1684 is formed over the pattern of thermal oxide 1681 and nitride 1682. Because the first thermal oxide 1681 functions as a partial diffusion barrier to further oxidation, and the nitride 1682 functions as a complete diffusion barrier to further oxidation, the thermal oxide 1684 reaches different depths at different areas according to the pattern of the thermal oxide 1681 and 1682. As shown in the next step, this will result in a stepped surface on the substrate 1601.

In this step, further patterning and additional oxidation may be performed in order to form a motion stopper with an insulation extension as shown in the process of FIGS. 15A-15G.

In step three (FIG. 16C), the thermal oxides (1681 and 1684) and nitride 1682 are removed. Due to the different depths reached by the second oxide 1684, the surface of the substrate 1601 has a stepped feature as shown.

In step four (FIG. 16D), a thermal oxide is formed and patterned to form anchors 1630.

In step five (FIG. 16E), an insulation layer 1640 is formed over the stepped surface of the substrate 1601. The resultant surface maintains the stepped future as shown.

In step six (FIG. 16F), a membrane layer 1620 is formed over the anchors 1630.

In step seven (FIG. 16G) a metal layer 1625 is deposited and patterned to form a top electrode. After this, the top layers including the membrane layer 1620 are etched through to separate individual cMUT elements.

FIGS. 17A-17E show an exemplary fabrication process to make localized non-flat areas. In this particular example, the non-flat surface is to effectuate a variable spring model and to enhance the electrical field in local areas. As illustrated below, the above methods illustrated in FIGS. 10-14 may also be used for such a purpose.

In step one (FIG. 17A), a thermal oxide 1781 and nitride 1782 are formed and patterned on substrate 1701. Small sizes of oxide 1781 and nitride 1782 are used in this pattern in order to make localized non-flat surfaces.

In step two (FIG. 17B), another layer of thermal oxide 1783 is formed over the pattern of thermal oxide 1781 and nitride 1782. Because the first thermal oxide 1781 functions as a partial diffusion barrier to further oxidation, and the nitride 1782 functions as a complete diffusion barrier to further oxidation, the thermal oxide 1783 reaches different depths at different areas according to the pattern of the thermal oxide 1781 and 1782. As shown in the next step, this will result in raised areas having sloped (curved) shoulders on the substrate 1701.

In step three (FIG. 17C), the thermal oxides (1781 and 1783) and nitride 1782 are removed. Due to the different depths reached by the second oxide 1783, the surface of the substrate 1701 has raised areas 1730 having sloped (curved) shoulders as shown. Optionally, an insulation layer 1735 is formed over the top surface of the substrate 1701 to cover both the raised areas 1730 and the flat areas. The raised areas 1730 may be used as anchors to support a membrane layer or spring layer, so no separate anchors may need to be formed.

In step four (FIG. 17D), an SOI layer 1703 including a membrane layer 1720 is bonded over the raised areas 1730 which function as anchors.

In step five (FIG. 17E), the SOI layer 1703 is etched back to leave the membrane layer 1720 on the anchors (raised areas) 1730. If the membrane layer 1720 is made of non-conductive material that is unsuitable to be an electrode, a metal layer may be deposited and patterned to form a top electrode. After this, the top layers including the membrane layer 1720 are etched through to separate individual cMUT elements.

FIGS. 18A-18F show an alternative fabrication process to make localized non-flat areas to effectuate a variable spring model and to enhance the electrical field in local areas. As shown, the alternative method does not use the oxidation process as described above. The steps of this alternative method are described below.

In step one (FIG. 18A), a substrate 1801 are patterned to form posts 1831.

In step two (FIGS. 18B and 18C), the corners of posts 1831 are rounded to form anchors 1830 having rounded (and sloped) shoulders. This can be accomplished using a number of techniques. With option 1 shown in FIG. 18B, an oxidation layer 1839 is first formed over the posts 1831, and is then removed to form the anchors 1830 having rounded shoulders. With option 2 shown in FIG. 18C, the corners of the posts 1830 are rounded by using hydrogen annealing at a proper temperature.

In step three (FIG. 18D), an insulation layer 1835 is formed over the top surface of the substrate 1801 to cover both the anchors 1830 and the flat areas.

In step four (FIG. 18E), a membrane layer 1820 is placed over the anchors 1830. This can be accomplished using a number of methods, including using SOI bonding technology as described previously.

In step five (FIG. 18F), if the membrane layer 1820 is made of non-conductive material that is unsuitable to be an electrode, a metal layer 1825 may be deposited and patterned to form a top electrode. After this, the top layers including the membrane layer 1820 are etched through to separate individual cMUT elements.

It is appreciated that although the above fabrication processes are illustrated using exemplary cMUT structures, the methods can be used to make a non-flat surface in other CMUT designs to form a variable spring model or form a non-uniform electrode gap. For example, similar non-flat surfaces may be formed on the substrate, spring layer, or surface plate layer in the CMUTs with embedded springs.

In addition to the methods described above, a non-flat surface in the micro-electro-mechanical transducer in accordance with the present invention may be made using a number of other methods. For example, a recess or recesses of a desired shape may be made by bending a layer with a desired thickness profile. In general, a layer with the desired thickness profile may be first formed by a proper process. The layer is then attached to another layer, such as a substrate with a desired pattern, to form cavities therebetween. Thereupon, a proper process is used to push selective areas of the layer with the thickness profile down to attach to the substrate layer. The surface of the bent layer thus forms a non-flat surface. The method may be used to form a non-flat surface on either the substrate, membrane, or the surface plate in any CMUT. Examples of the method are described below.

FIGS. 19A-19H show an alternative fabrication process to make a non-flat surface in the micro-electro-mechanical transducer in accordance with the present invention. The steps of the process are described below.

In step one (FIG. 19A), cavities 1906 and posts 1905 are formed on substrate 1901 two partially define the shape of the bottom electrode to be formed.

In step two (FIG. 19B), a first membrane layer 1910 is formed over the cavities 1906 and posts 1905. This may be accomplished in a number of ways, including bonding a prime wafer, grinding and polishing the prime wafer to a desired thickness; and bonding an SOI wafer with a desired membrane layer and action back the SOI wafer. The bonding may be performed in vacuum.

In step three (FIGS. 19C-19E), the first membrane layer 1910 is bent to form a desired non-flat shape of the bottom electrode. If the first membrane layer 1910 and the substrate 1901 cannot adequately provide the function of a bottom electrode, a separate metal layer (not shown) may be deposited to form the bottom electrode.

Bending of the membrane layer 1910 may be accomplished in a number of ways. In option one shown in FIG. 19C, the wafer is annealed in an environment with a desired temperature and pressure to cause the membrane layer 1910 to bend down in unsupported areas. When properly controlled, the dropped portions of the membrane layer 1910 may touch the substrate 1901 and permanently bond with it.

Figure 19A:
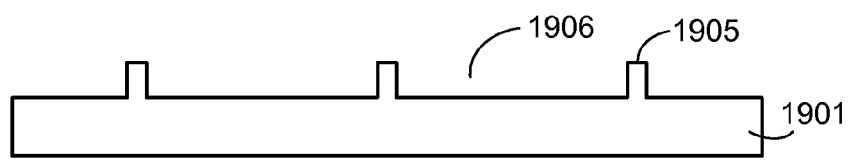
FIGS. 19A-19H show an alternative fabrication process to make a non-flat surface in a micro-electro-mechanical transducer in accordance with the present invention.
Figure 19B:
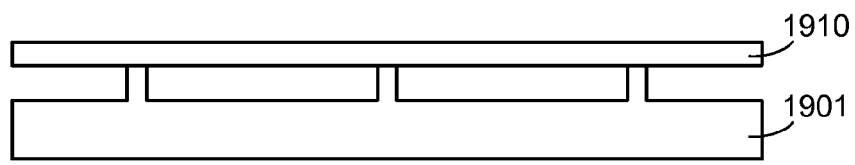
Figure 19C:
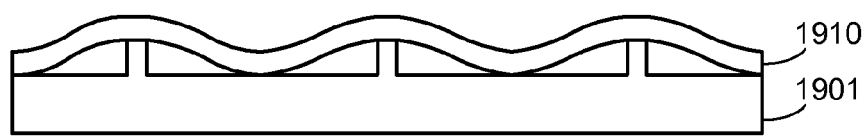
Figure 19D:
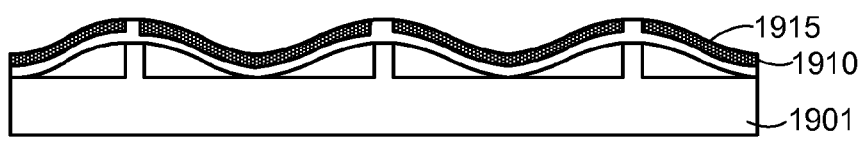

In option two shown in FIG. 19D, the membrane layer 1910 is doped with a desired doping material 1915 to create a doping profile that introduces a desired stress profile in the membrane. The selectively stressed membrane layer 1910 is then annealed to cause pending. In the example shown, the membrane layer 1910 is spent to touch the substrate 1901 and permanently bonded with it after the annealing process.

Figure 19E:
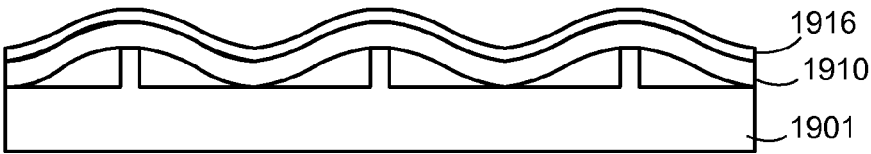
Figure 19F:
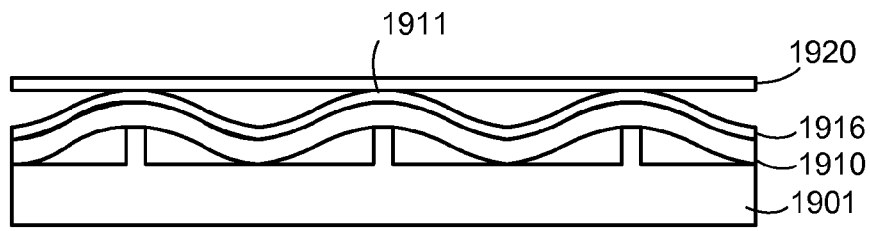
Figure 19G:
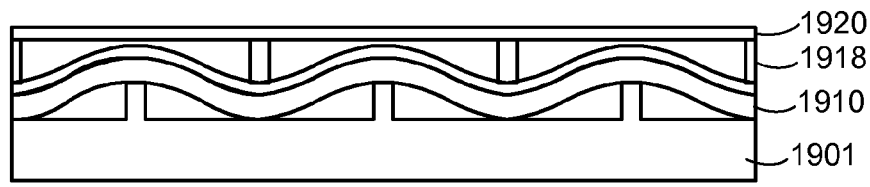
Figure 19H:
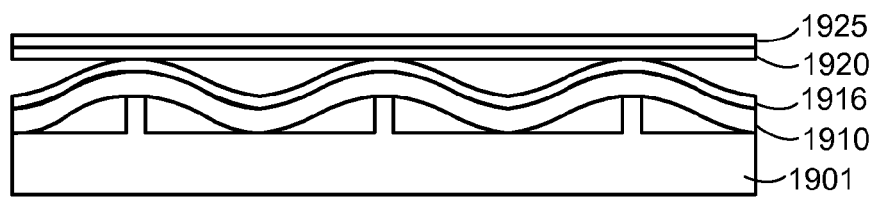

In option three shown in FIG. 19E, a layer 1916 of a desired material (e.g., thermal oxide, LTO, or silicon nitride) with a desired internal stress (such as a bimorph structure) is formed or deposited on the membrane layer 1910 to bend the membrane layer 1910 to a desired shape as shown. The bent membrane 1910 may touch the substrate 1901 and permanently bond with it after the bending process.

After bending, the bent first membrane layer 1910 and the substrate 1901 may together function as a bottom electrode if a conductive material is used for these two layers. However, a separate conductive layer (not shown) may be introduced on or beneath the membrane layer 1910 as the bottom electrode, shaped similarly to the bent membrane layer 1910. An insulation layer (e.g., oxide or nitride) may be grown either on a shaped electrode or on the membrane layer 1910 before bonding the second membrane layer as shown below.

In step four (FIGS. 19F and 19G), a second membrane layer (spring layer) 1920 is introduced over the bent first membrane layer 1910 which has raised areas 1911 having sloped shoulders to support the second membrane layer (spring layer) 1920. Two slightly different options to accomplish this are described in FIG. 19F and FIG. 19G. In option 1 shown in FIG. 19F, the second membrane layer 1920 is placed on the bent first membrane layer (including a shaped bottom electrode) and is supported by the same directly. In option 2 shown in FIG. 19G, a thick insulation layer (e.g., oxide or nitride) is grown and patterned as anchors 1918, and the second membrane layer 1920 is then bonded to the anchors 1918 and supported by the same.

In step five (FIG. 19H), a metal layer 1925 is deposited and patterned as a top electrode. The second (top) membrane layer 1920 and metal layer 1925 are then etched to separate the cMUT elements.

FIGS. 20A-20F show another fabrication process to make a non-flat surface in the micro-electro-mechanical transducer in accordance with the present invention. The steps of the process are described below.

In step one (FIG. 20A), a desired recession pattern 2071 is formed on a wafer 2070, which may be either a prime wafer or an SOI wafer. An SOI wafer may be preferred in this step if the membrane thickness needs to be precisely controlled.

In step two (FIG. 20B), the wafer 2070 is further patterned to define the shapes of the membrane to be formed. In the example shown, the pattern has posts 2072 and posts 2074 having different heights. The posts define cavities on the wafer 2070.

In step three (FIG. 20C), the patterned wafer 2070 is bonded with another wafer 2001. After bonding, the patterned wafer 2070 is grounded and polished (or etched back if an SOI wafer was used) to a membrane 2070 of a desired thickness. The bonding may be performed in vacuum. As shown, after bonding, the membrane 2070 is supported by the taller posts 2074, while the shorter posts 2072 do not reach far enough to contact the substrate 2001.

In step four (FIG. 20D), the membrane 2070 is bent down using a proper method, such as any of the methods described in step three in FIGS. 19C-19E. As a result of bending, the membrane 2070 now has raised parts 2075 and depressed areas 2076. As shown, the raised parts 2075 each has rounded (and sloped) shoulders. The shape of the lower parts 2076 may be controlled by the width of the posts 2072. As shown, when relatively wide posts 2072 are used, the lower parts 2076 may have a relatively flat surface. If narrower posts 2072 are used, the lower parts 2076 may have a more curved shape that is closer to the shape of the membrane 1910 shown in FIG. 19.

After bending, the shorter posts 2072 of the membrane 2070 may touch the bottom of the cavity on the substrate 2001 and be bonded with it using a proper treatment.

Figure 20A:
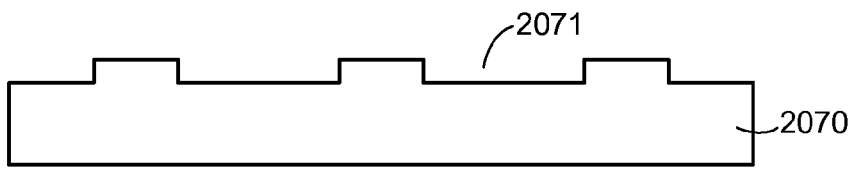
FIGS. 20A-20F show another fabrication process to make a non-flat surface in a micro-electro-mechanical transducer in accordance with the present invention.
Figure 20B:
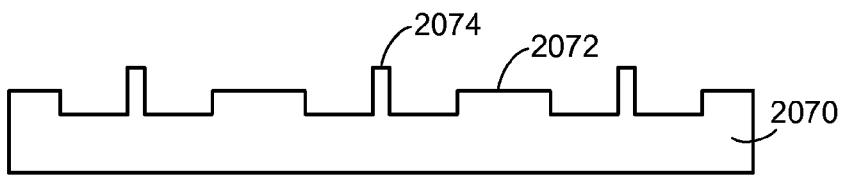
Figure 20C:
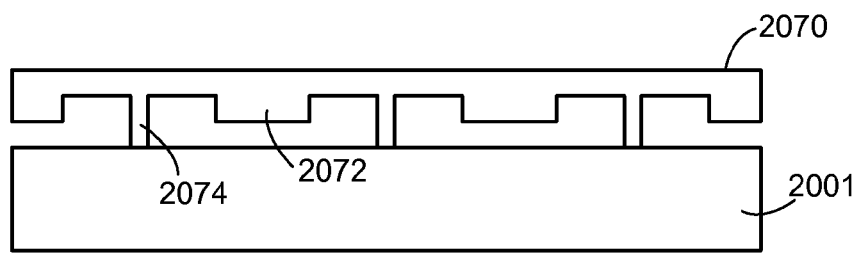
Figure 20D:
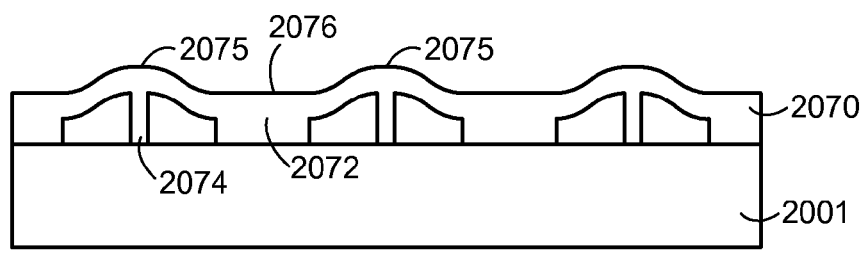
Figure 20E:
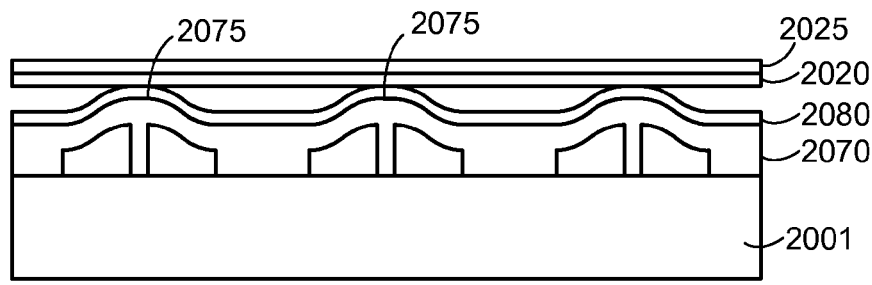
Figure 20F:
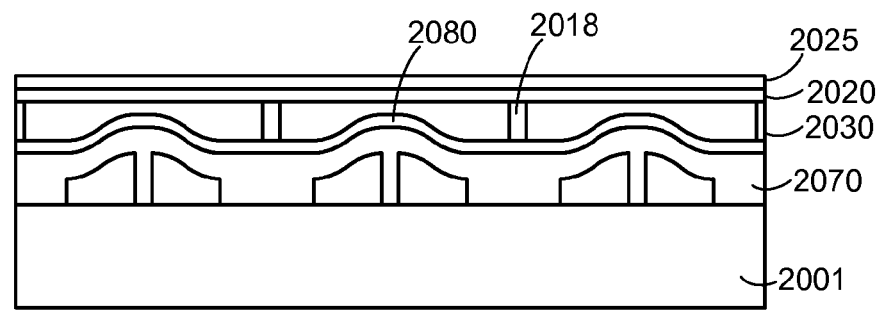
Figure 21A:
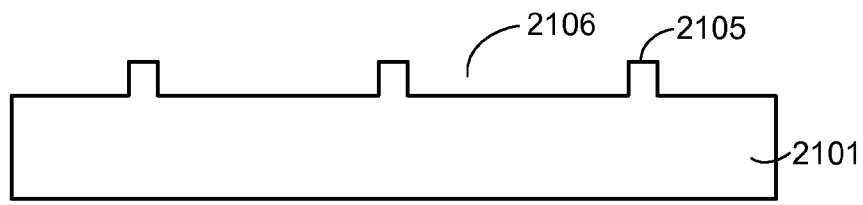
FIGS. 21A-21E show another fabrication process to make a non-flat surface in a micro-electro-mechanical transducer in accordance with the present invention.
Figure 21B:
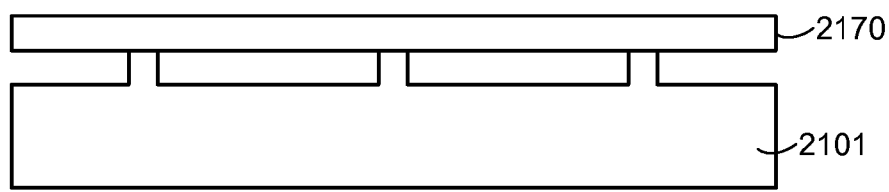
Figure 21C:
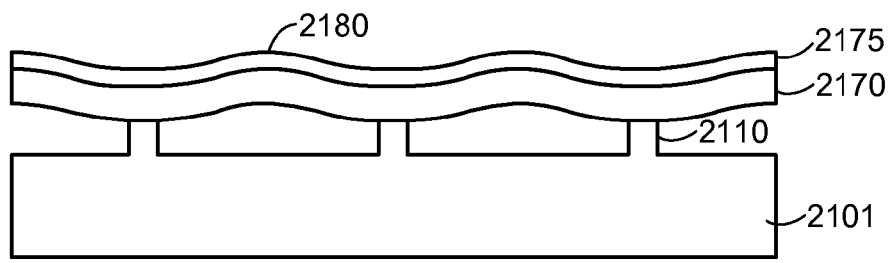
Figure 21D:
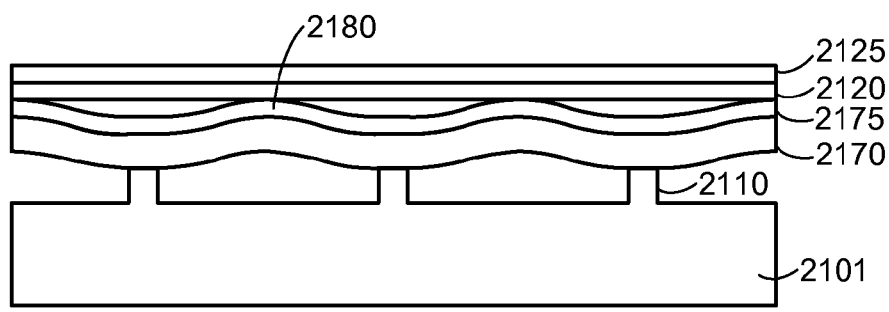
Figure 21E:
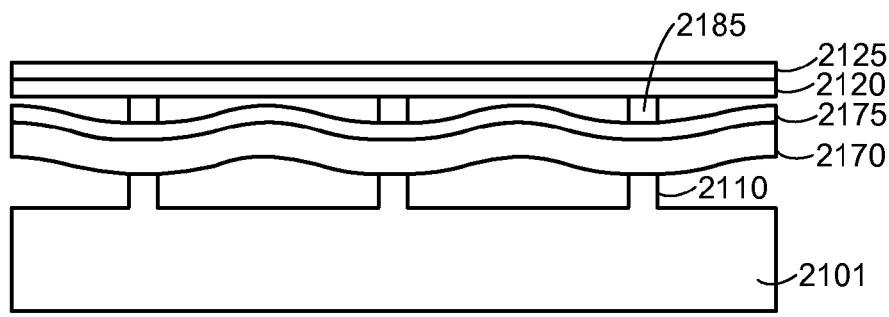
Figure 22A:
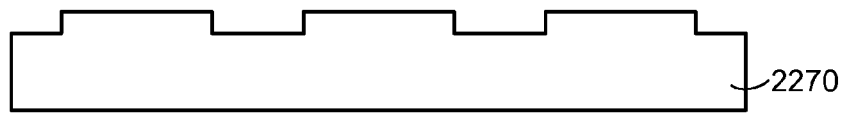
FIGS. 22A-22E show another fabrication process to make a non-flat surface in a micro-electro-mechanical transducer in accordance with the present invention.
Figure 22B:
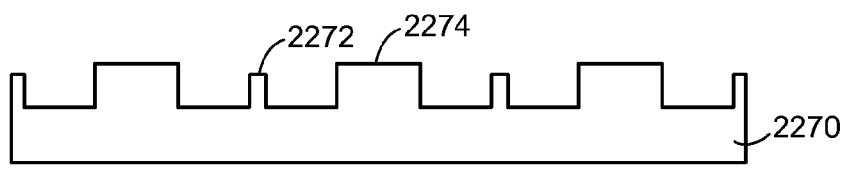
Figure 22C:
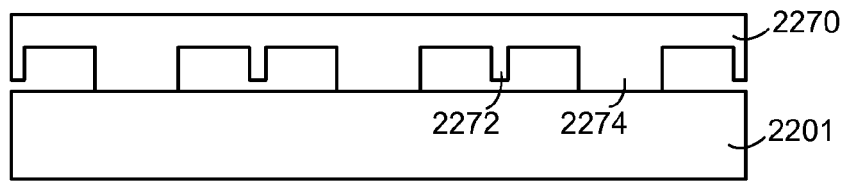
Figure 22D:
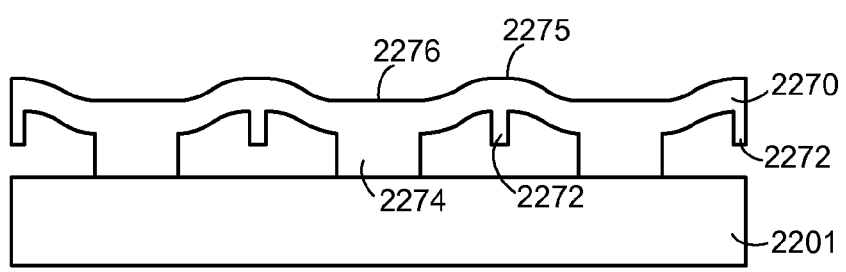
Figure 22E:
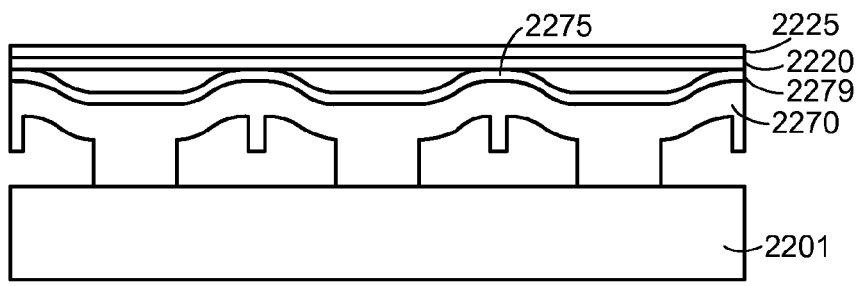
Figure 23A:
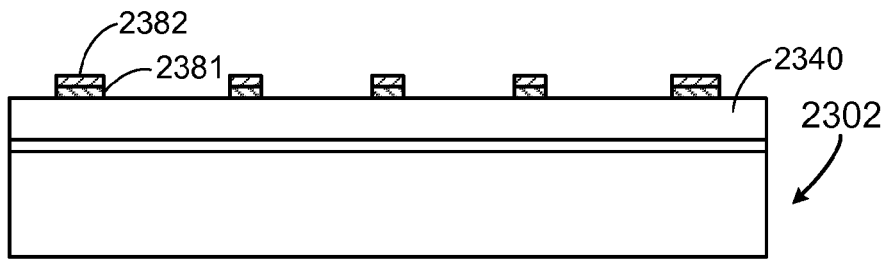
FIGS. 23A-23I show a fabrication process to make ESMUT having a non-flat surface in accordance with the present invention.
Figure 23B:
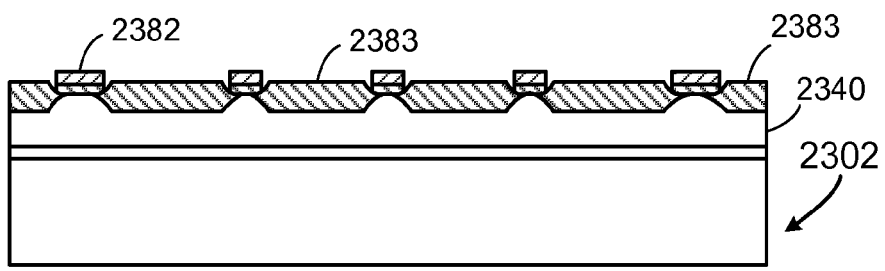
Figure 23C:
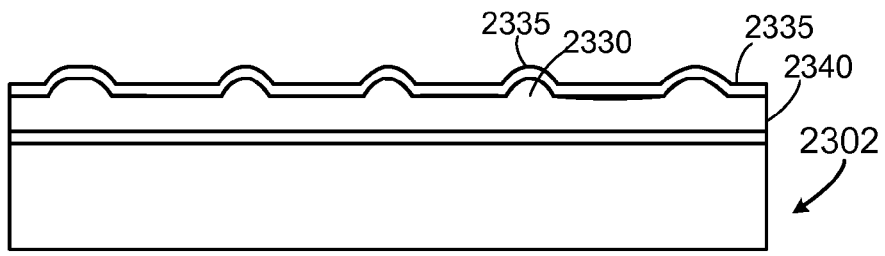
Figure 23D:
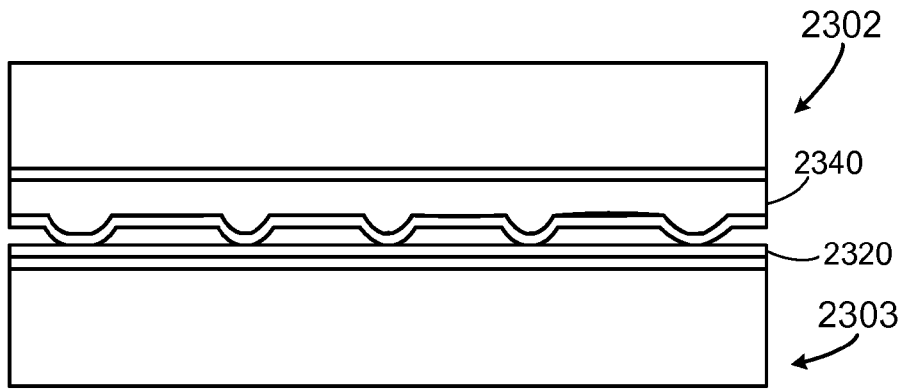
Figure 23E:
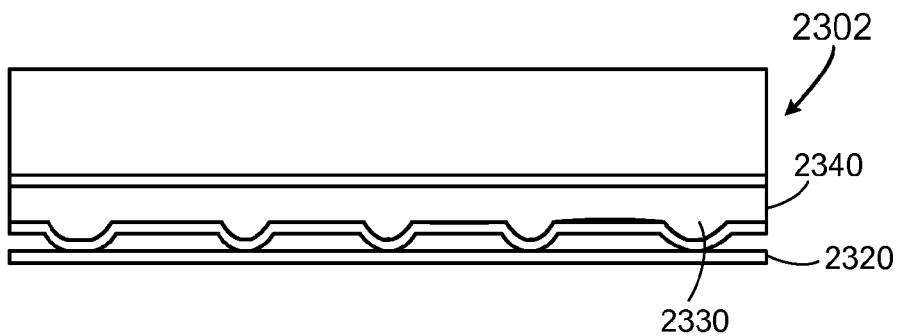
Figure 23F:
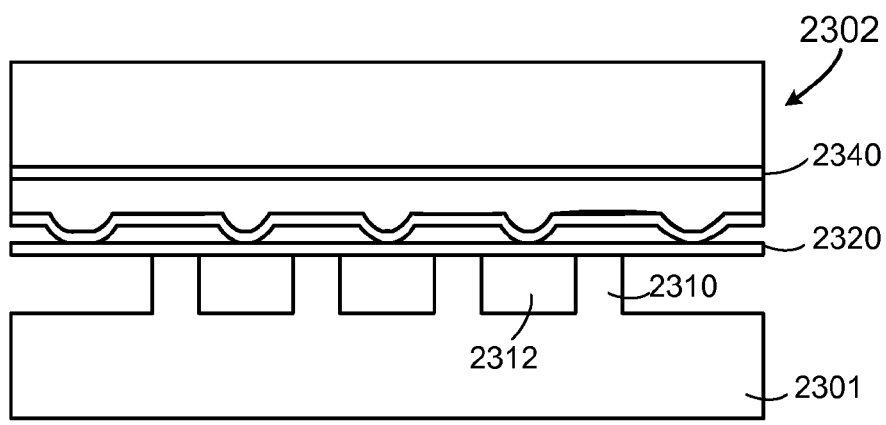
Figure 23G:
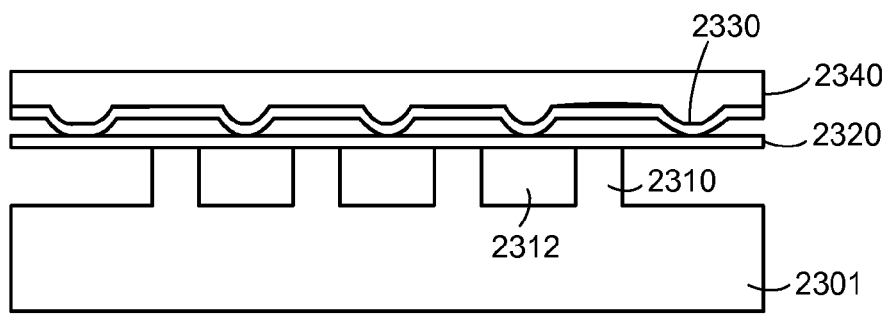
Figure 23H:
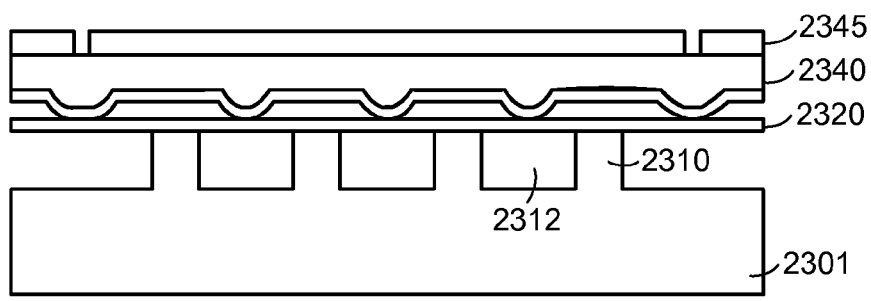
Figure 23I:
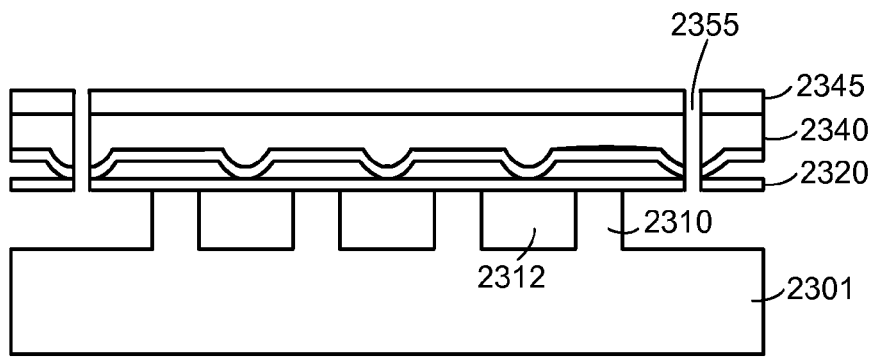

In step five (FIGS. 20E and 20F), a second membrane layer (spring layer) 2020 is introduced over the first bent membrane layer 2070 which has raised parts 2075 having sloped shoulders to support the second membrane layer (spring layer) 2020. Two slightly different options to accomplish this are described in FIGS. 20E and 20F. In option 1 shown in FIG. 20E, the second membrane layer 2020 is placed on the first bent membrane layer 2070 (including a shaped bottom electrode) and is supported by the same directly. An optional insulation layer 2080 is also shown in FIG. 20E. In option 2 shown in FIG. 20F, a thick insulation layer (e.g., oxide or nitride) is grown and patterned as anchors 2018, and the second membrane layer 2020 is then bonded to the anchors 2018 and supported by the same. In this step, metal layer 2025 may also be deposited and patterned as a top electrode. The second (top) membrane layer 2020 and metal layer 2025 are then etched to separate the cMUT elements.

FIGS. 21A-21E show another fabrication process to make a non-flat surface in the micro-electro-mechanical transducer in accordance with the present invention. The process is similar to the process described in FIGS. 19A-19H. The steps of the process are described below.

In step one (FIG. 21A), cavities 2106 and posts 2105 are formed on substrate 2101 two partially define the shape of the bottom electrode to be formed.

In step two (FIG. 21B), a first membrane layer 2170 is formed over the cavities 2106 and posts 2105.

In step three (FIG. 21C), the first membrane layer 2170 is bent to form a desired non-flat shape of the bottom electrode. An optional insulation layer 2175 is also shown. Bending of the membrane layer 2170 may be accomplished in a number of ways as described in FIGS. 19C-19E). Unlike that in FIG. 19, the membrane layer 2170 is bent upward to form raised areas 2180.

After bending, the bent first membrane layer 2170 and the substrate 2101 may function as a bottom electrode if a conductive material is used for these two layers. However, a separate conductive layer (not shown) may be introduced on or beneath the membrane layer 2170 as the bottom electrode, shaped similarly to the bent membrane layer 2170.

In step four (FIGS. 21D and 21E), a second membrane layer (spring layer) 2120 is introduced over the bent first membrane layer 2170 which has raised areas 2180 having sloped shoulders to support the second membrane layer (spring layer) 2120. Two slightly different options to accomplish this are described in FIGS. 21D and 21E. In option 1 shown in FIG. 21D, the second membrane layer 2120 is placed on the bent first membrane layer 2170 (including a shaped bottom electrode) and is supported by the same directly. In option 2 shown in FIG. 21F, a thick insulation layer (e.g., oxide or nitride) is grown and patterned as anchors 2185, and the second membrane layer 2120 is then bonded to the anchors 2185 and supported by the same.

FIGS. 22A-22E show another fabrication process to make a non-flat surface in the micro-electro-mechanical transducer in accordance with the present invention. The steps of the process are described below.

In step one (FIG. 22A), a desired recession pattern is formed on a wafer 2270.

In step two (FIG. 22B), the wafer 2270 is further patterned to define the shapes of the membrane to be formed. In the example shown, the pattern has posts 2272 and posts 2274 having different heights. The posts define cavities on the wafer 2270.

In step three (FIG. 22C), the patterned wafer 2270 is bonded with another wafer 2201. After bonding, the patterned wafer 2270 is grounded and polished (or etched back if an SOI wafer was used) to a membrane 2270 of a desired thickness. The bonding may be performed in vacuum. As shown, after bonding, the membrane 2270 is supported by the taller posts 2274, while the shorter posts 2272 do not reach far enough to contact the substrate 2201.

In step four (FIG. 22D), the membrane 2270 is bent upward using a proper method, such as any of the methods described in step three in FIGS. 19C-19E. As a result of bending, the membrane 2270 now has raised parts 2275 and depressed areas 2276. As shown, the raised parts 2275 each has rounded (and sloped) shoulders. The shape of the lower parts 2276 may be controlled by the width of the posts 2274. As shown, when relatively wide posts 2274 are used, the lower parts 2276 may have a relatively flat surface. If narrower posts 2274 are used, the lower parts 2276 may have a more curved shape that is closer to the shape of the membrane 1910 shown in FIG. 19.

In step five (FIG. 22E), a second membrane layer (spring layer) 2220 is introduced over the first bent membrane layer 2270 which has raised parts 2275 having sloped shoulders to support the second membrane layer (spring layer) 2220. An optional insulation layer 2279 may also be used.

The methods of the present invention may also be used being spring embedded micromachined ultrasonic transducers (ESMUT) as disclosed in the several patent applications referenced and incorporated herein. Examples are described below.

FIGS. 23A-23I show a fabrication process to make ESMUT having a non-flat surface in accordance with the present invention. The steps of the fabrication process are described below.

The first five steps (FIGS. 23A-23E) are similar to that described in FIGS. 17A-17E. In step one (FIG. 23A), a thermal oxide 2381 and nitride 2382 are formed and patterned on a plate layer 2340 which is a part of an SOI wafer 2302. Alternatively, instead of using an SOI wafer, a primal wafer may be used which can be grounded and polished to form the plate layer 2340. Small sizes of oxide 2381 and nitride 2382 are used in this pattern in order to make localized non-flat surfaces.

In step two (FIG. 23B), another layer of thermal oxide 2383 is formed over the pattern of thermal oxide 2381 and nitride 2382. Because the first thermal oxide 2381 functions as a partial diffusion barrier to further oxidation and the nitride 2382 functions as a complete diffusion barrier to further oxidation, the thermal oxide 2383 reaches different depths at different areas according to the pattern of the thermal oxide 2381 and 2382. As shown in the next step, this will result in raised areas having sloped (curved) shoulders on the plate layer 2340.

In step three (FIG. 23C), the thermal oxides (2381 and 2383) and nitride 2382 are removed. Due to the different depths reached by the second oxide 2383, the surface of the plate layer 2320 has raised areas 2330 having sloped (curved) shoulders as shown. Optionally, an insulation layer 2335 is formed over the top surface of the substrate 2301 to cover both the raised areas 2330 and the flat areas. The raised areas 2330 may be used as anchors to support a spring layer, so no separate anchors need to be formed.

In step four (FIG. 23D), an SOI layer 2303 including a spring layer 2320 is bonded over the raised areas 2330 which function as anchors.

In step five (FIG. 23E), the SOI layer 2303 is etched back to leave the spring layer 2320 on the anchors (raised areas) 2330.

In step six (FIG. 23F), the wafer from the step five is bonded to a silicon wafer 2301 which has a cavity pattern 2312 and anchors 2310 to define the spring shapes. The wafer from the step five may also be bonded to a substrate with through-wafer connections, a PCB, or a wafer with desired ICs using proper bonding technologies.

In step seven (FIG. 23G), the handle wafer and the box (oxide) of the SOI wafer 2302 are removed to form surface plate 2340.

In step eight (FIG. 23H), a metal layer 2345 is deposited and patterned as the top electrode. The bottom electrode is located either on the spring layer 2320 or the silicon wafer 2301. If the spring layer 2320 is made of non-conductive material that is unsuitable to be an electrode, a metal layer (not shown) may be deposited and patterned to form a bottom electrode.

In step nine (FIG. 23I), the surface plate 2340 and spring layer 2320 are patterned by forming trenches 2355 to separate the cMUT elements.

FIGS. 24A-24I show another fabrication process to make ESMUT having a non-flat surface in accordance with the present invention. The steps of the fabrication process are described below.

The first five steps (FIGS. 24A-24E) are similar to that described in FIGS. 17A-17E. In step one (FIG. 24A), a desired recession pattern 2481 is formed on a wafer 2402, which may be either a prime wafer or an SOI wafer.

In step two (FIG. 24B), the wafer 2402 is further patterned to define the shapes of the membrane to be formed. In the example shown, the pattern has posts 2411 and posts 2410 having different heights. The posts define cavities on the wafer 2402.

In step three (FIG. 24C), the patterned wafer 2402 is bonded with another wafer 2401. After bonding, the patterned wafer 2402 is grounded and polished (or etched back if an SOI wafer was used) to a membrane 2402 of a desired thickness. The bonding may be performed in vacuum. As shown, after bonding, the membrane 2402 is supported by the taller posts 2410, while the shorter posts 2411 do not reach far enough to contact the substrate wafer 2401.

In step four (FIG. 24D), the membrane 2402 is bent down using a proper method, such as any of the methods described in step three in FIGS. 19C-19E. As a result of bending, the membrane 2402 now has raised parts 2409 and depressed areas 2407. As shown, the raised parts 2409 each has rounded (and sloped) shoulders 2408. The shape of the raised parts 2409 may be control the by the width of posts to 410. As shown, when relatively wide posts 2410 are used, the raised parts 2409 may have a relatively flat top surface. If narrower posts to 410 are used, the raised parts 2409 may have a more curved or appointed shape that is closer to the shape of the membrane 1910 shown in FIG. 19. Likewise, the shape of the lower parts to fault 07 may be controlled by the width of the posts 2411

After bending, the shorter posts 2411 of the membrane 2401 may touch the bottom of the cavity on the substrate 2401 and be bonded with it using a proper treatment.

Figure 24A:
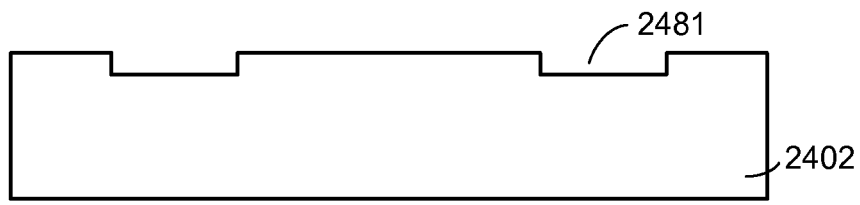
FIGS. 24A-24I show another fabrication process to make ESMUT having a non-flat surface in accordance with the present invention.
Figure 24B:
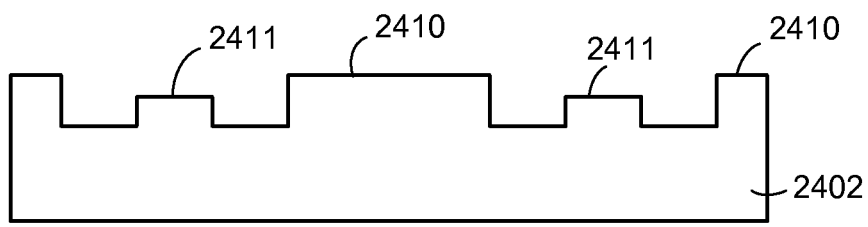
Figure 24C:
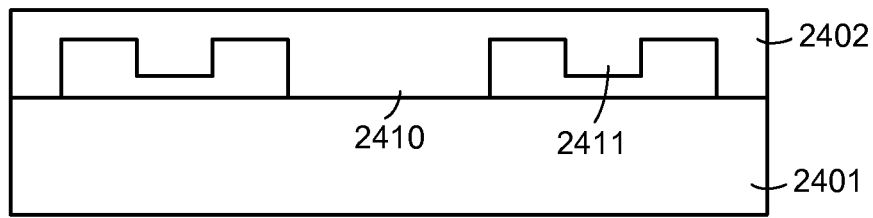
Figure 24D:
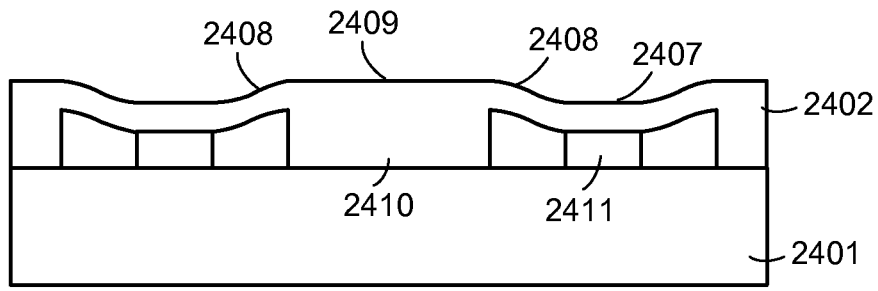
Figure 24E:
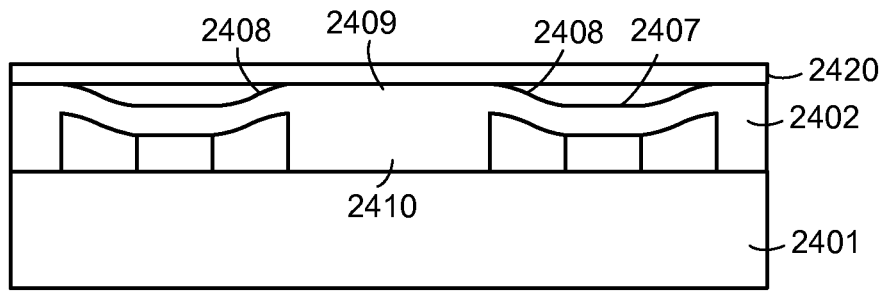
Figure 24F:
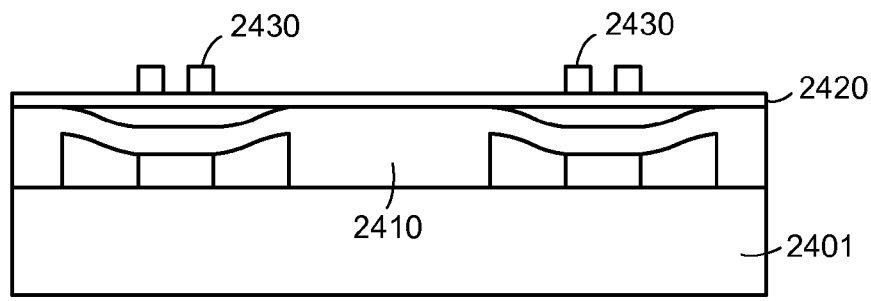
Figure 24G:
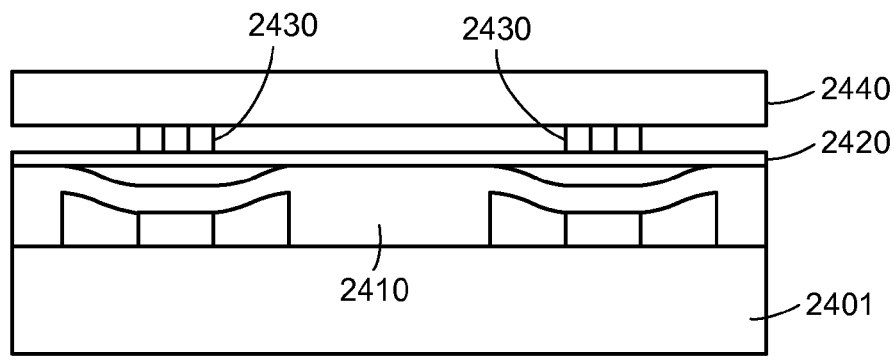
Figure 24H:
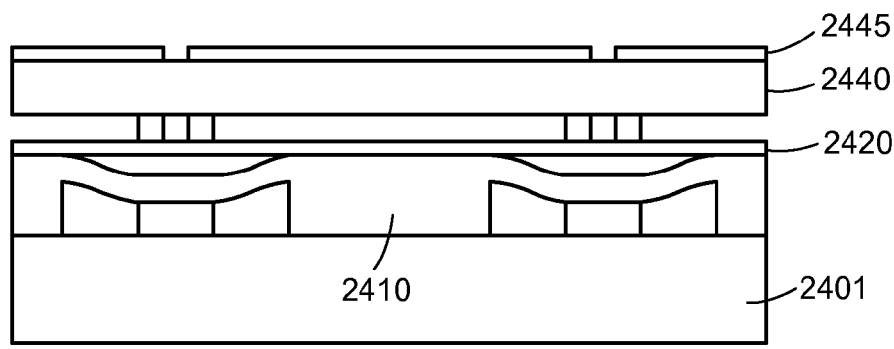
Figure 24I:
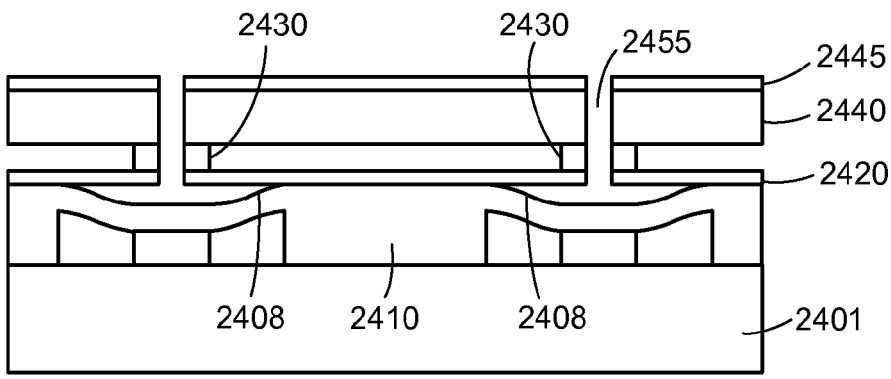
Figure 25A:
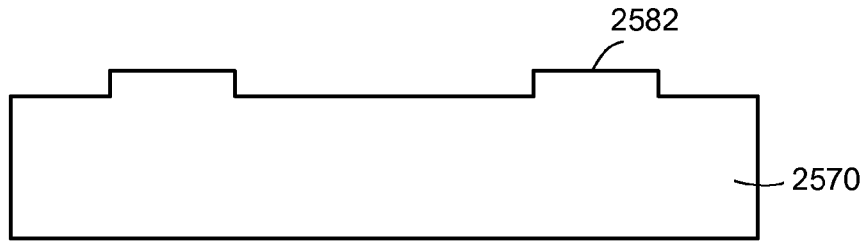
FIGS. 25A-25I show another fabrication process to make ESMUT having a non-flat surface in accordance with the present invention.
Figure 25B:
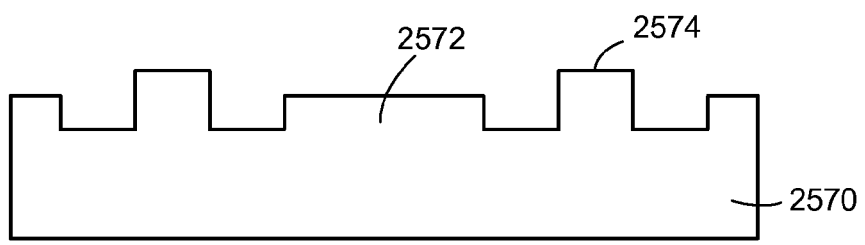
Figure 25C:
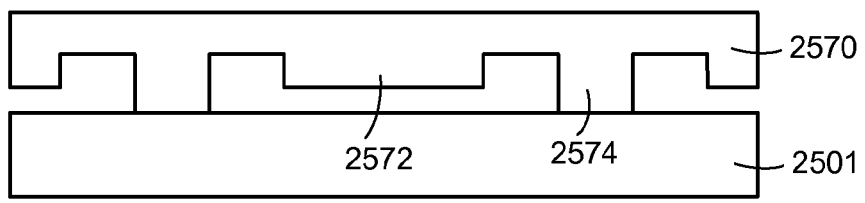
Figure 25D:
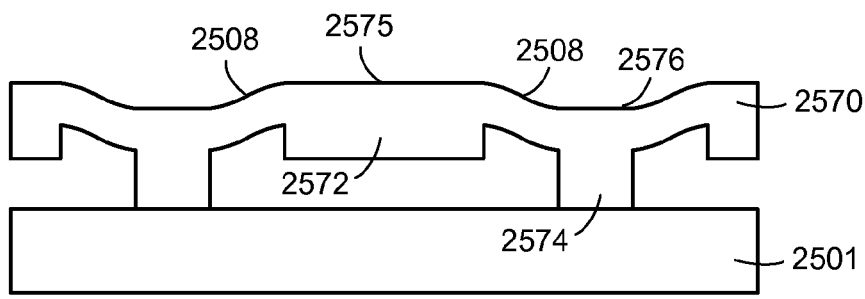
Figure 25E:
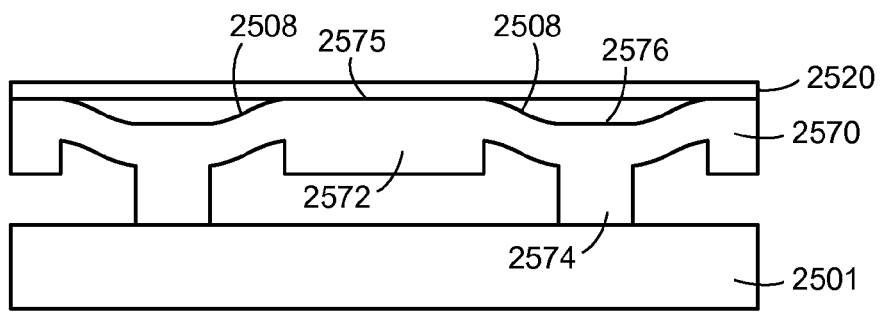
Figure 25F:
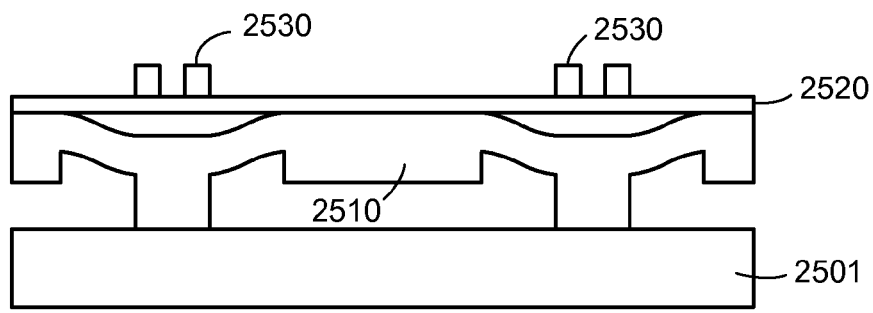
Figure 25G:
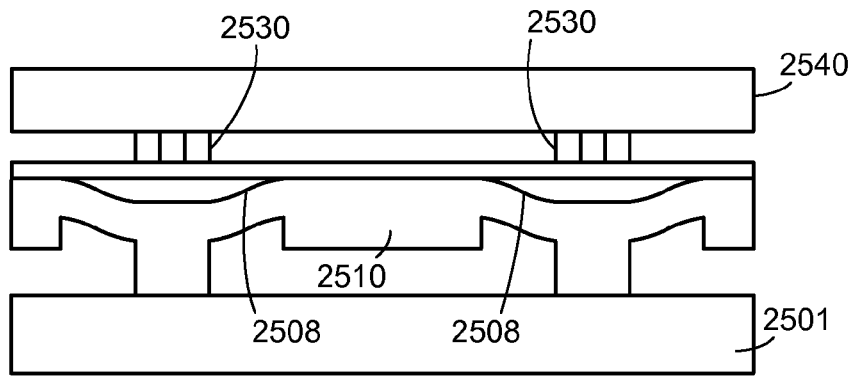
Figure 25H:
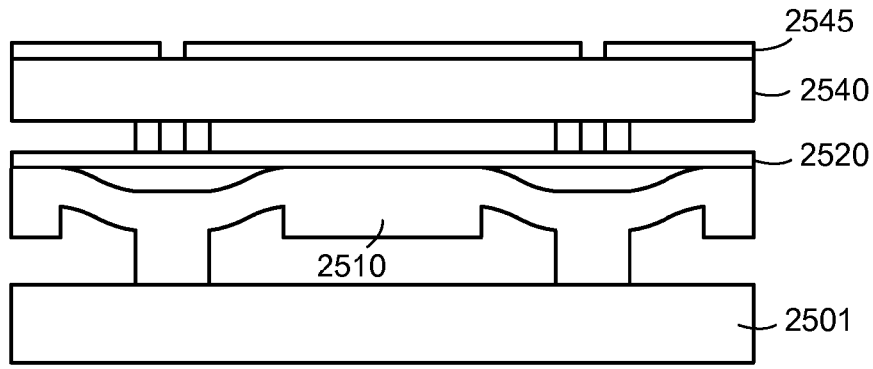
Figure 25I:
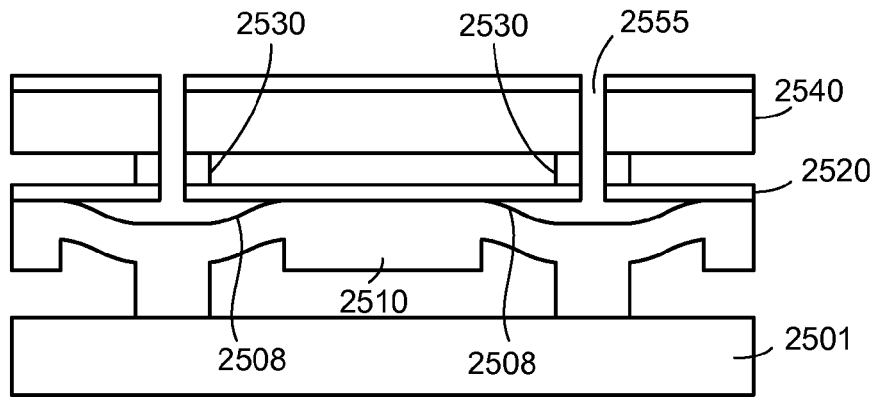

In step five (FIG. 24E), a spring layer 2420 is introduced over the bent membrane 2402 which has raised parts to 2409 having sloped shoulders 2408 to support the spring 2420. As shown in FIG. 24E, the spring layer 2420 is placed on the bent membrane layer 2401 (including a shaped bottom electrode not shown) and is supported by the same directly.

In step six (FIG. 24F), an insulation layer (e.g., thermal oxide, or nitride) is grown (or deposited) and patterned to form the plate-spring connectors 2430 on the spring layer 2420.

In step seven (FIG. 24G), an SOI wafer (or a prime wafer) with desired surface plate 2440 is bonded over on the plate-spring connectors 2430. The SOI wafer (or a prime wafer) is processed to leave the surface plate 2440 on the plate-spring connectors.

In step eight (FIG. 24H), a metal layer 2445 is deposited and patterned as the top electrode.

In step nine (FIG. 24I), trenches 2455 are formed through the surface plate 2440 and the spring layer 2420 to separate the cMUT elements.

FIGS. 25A-25I show another fabrication process to make ESMUT having a non-flat surface in accordance with the present invention. The steps of the fabrication process are described below.

The first five steps (FIGS. 25A-25E) are similar to that described in FIGS. 22A-22E. In step one (FIG. 25A), a desired surface pattern 2582 is formed on a wafer 2570.

In step two (FIG. 25B), the wafer 2570 is further patterned to define the shapes of the membrane to be formed. In the example shown, the pattern has posts 2572 and posts 2574 having different heights. The posts define cavities on the wafer 2570.

In step three (FIG. 25C), the patterned wafer 2570 is bonded with another wafer 2501. After bonding, the patterned wafer 2570 is grounded and polished (or etched back if an SOI wafer was used) to a membrane 2570 of a desired thickness. The bonding may be performed in vacuum. As shown, after bonding, the membrane 2570 is supported by the taller posts 2574, while the shorter posts 2572 do not reach far enough to contact the substrate 2501.

In step four (FIG. 25D), the membrane 2570 is bent upward using a proper method, such as any of the methods described in step three in FIGS. 19C-19E. As a result of bending, the membrane 2570 now has raised parts 2575 and depressed areas 2576. As shown, the raised parts 2575 each has rounded (and sloped) shoulders 2508. The shape of the raised parts 2575 may be controlled by the width of the posts 2572. As shown, when relatively wide posts 2572 are used, the raised parts 2572 may have a relatively flat top surface. Likewise, the shape of the lower parts 2576 may be controlled by the width of the posts 2574.

In step five (FIG. 25E), a second membrane layer (spring layer) 2520 is introduced over the bent membrane layer 2570 which has raised parts 2575 having sloped shoulders to support the spring layer 2520.

In step six (FIG. 25F), an insulation layer (e.g., thermal oxide, or nitride) is grown (or deposited) and patterned to form the plate-spring connectors 2530 on the spring layer 2520.

In step seven (FIG. 25G), an SOI wafer (or a prime wafer) with desired surface plate 2540 is bonded over on the plate-spring connectors 2530. The SOI wafer (or a prime wafer) is processed to leave the surface plate 2540 on the plate-spring connectors.

In step eight (FIG. 25H), a metal layer 2545 is deposited and patterned as the top electrode.

In step nine (FIG. 25I), trenches 2555 are formed through the surface plate 2540 and the spring layer 2520 to separate the cMUT elements.

In general, the present invention introduces several unique methods to form a non-flat surface. One distinctive example is using oxidation combined with patterning of diffusion barriers to form a recess of various shapes. Another distinctive example is forming a non-flat surface with raised portions or dropped portions by bending a layer having a certain thickness profile attached to another layer. Although distinctive from each other, these methods may be used to accomplish similar purposes and are often interchangeable for fabrication purposes. The methods to form a non-flat surface may be used in free combination with any proper fabrication processes to make a micro-electro-mechanical transducer having a non-flat surface. Depending on the design, a non-flat surface may be that of a substrate, a spring layer, a connector or anchor, a plate, or any combination thereof. If multiple non-flat surfaces (or multiple non-flat areas of a certain surface) need to be made according to a certain design, either a single method or a combination of several methods as described herein may be used.

It is appreciated that, although the variable springs in accordance with the present invention are illustrated using several particular designs of cMUT, the designs and fabrication methods for the cMUT with variable springs can be applied to a cMUT of any other designs, including cMUTs with embedded springs configured differently from the examples shown herein.

Since the device parameters in the cMUT with embedded springs can be designed nearly independently, the equivalent spring constant of the cMUT with embedded springs may be designed to increase with the displacement as desired without any trade-off with other device performances. As a result, the cMUT with embedded springs may operate like an idea parallel plate capacitor but still be able to increase the collapse voltage of the transducer. With the design in accordance with the present invention, particularly when applied in the cMUT with embedded springs, it may be possible to push the collapse voltage significantly higher than the operation voltage range to nearly entirely avoid collapse. The cMUT with variable springs may have a maximum displacement nearly as large as the total electrode separation gap, in contrast to the roughly ⅓ of the electrode separation gap for an idea parallel plate capacitor with a constant spring constant. The performance of the cMUT can therefore be dramatically improved by this approach.

Furthermore, with a proper design in accordance with the present invention, the two electrodes of the cMUT with embedded variable springs may practically never contact each other, thus potentially eliminating the need of an insulation layer.

Furthermore, the cMUT with embedded springs in accordance with the present invention may operate nearly like an idea parallel capacitor in all operation range (although it is within the purview of the present invention to have a nonparallel or nonuniform capacitor to improve the dynamic uniformity in operation, particularly when applied to conventional membrane-based cMUTs). The cMUT with embedded variable springs in accordance with the present invention has potential to solve many problems of the conventional cMUT. Moreover, the cMUT with embedded variable springs is expected to have much better performance in other respects as well, as disclosed in the several patent applications referenced and incorporated in this description.

The cMUT of the present invention, including that with embedded variable springs, may be fabricated by the whole or part of the methods described herein, further in combination with the methods (e.g., wafer-bonding, surface micromachining, or any combination of two technologies) described in the several patent applications reference to and incorporated in this description. The material selection for each layer in the design of the present invention is similar to that described in those referenced and incorporated patent applications.

Other refinement of the design may also be considered. For example, in a cMUT, if two surfaces may contact each other during the operation, the surfaces may desirably be rough in order to reduce the total contact area. Examples of such contacting surfaces include the flexible cMUT membrane and the bottom surface of the cavity for a cMUT with flexible membranes, and the spring layer and the bottom surface of the cavity for a cMUT with embedded springs. The contacting surfaces may be made rough by patterning the surface to a desired pattern. The contacting surfaces may also be roughed by chemical etching or plasma etching (usually with very slow etching rate) in a desired area.

In addition, a perfect vacuum may not be achieved in a sealed cMUT cavity. For a certain cMUT design, because the volume of a cavity may be dramatically shrunk during the operation, any residual air may cause problems such as high pressure buildup. In order to avoid of the undesired high pressure buildup, buffer trenches may be formed on the cavity surface. The trenches may be fabricated by patterning the bottom of the cavity after the bottom surface of the cavity is formed.

FIGS. 26A-26D show an exemplary fabrication process to roughen the bottom surface of the cavity and to fabricate buffer trenches on the bottom of the cavity. The steps of the process are described below.

In step one (FIG. 26A), a curved surface is formed on substrate 2601. The contacting surface 2602 needs to be roughened. The exemplary contacting surface 2602 is the area where the top and bottom surfaces of the wedge-shaped cavity contact during operation of the cMUT.

In step two (FIG. 26B), buffer trenches 2691 are formed on the bottom surface of the cavity on substrate 2601.

In step three (FIG. 26C), flexible membrane or spring layer 2620 is placed over the cavity.

In step four (FIG. 26D), the flexible membrane or spring layer 2620 makes contact with the contacting surface 2602 of the cavity during operation.

The roughened contacting surface 2602 is shown in the zoomed window. As shown, the contacting surface is roughened by etching spots 2695.

The micro-electro-mechanical transducer in accordance with the present invention has been described in detail along with the figures and exemplary embodiments. The design of the micro-electro-mechanical transducer of the present invention is particularly suitable for applications in capacitive micromachined ultrasonic transducers (cMUT), but can also be used in other micro-electro-mechanical devices which have a movable mechanical part to transform energy.

In particular, the micro-electro-mechanical transducer in accordance with the present invention may be fabricated using the fabrication methods or incorporated in the micro-electro-mechanical transducer as disclosed in international patent applications (PCT) No. PCT/IB2006/051566, entitled THROUGH-WAFER INTERCONNECTION, filed on May 18, 2006; No. PCT/IB2006/051567, entitled METHODS FOR FABRICATING MICRO-ELECTRO-MECHANICAL DEVICES, filed on May 18, 2006; No. PCT/IB2006/051568, entitled MICRO-ELECTRO-MECHANICAL TRANSDUCERS, filed on May 18, 2006; No. PCT/IB2006/051569, entitled MICRO-ELECTRO-MECHANICAL TRANSDUCERS, filed on May 18, 2006; and No. PCT/IB2006/051948, entitled MICRO-ELECTRO-MECHANICAL TRANSDUCER HAVING AN INSULATION EXTENSION, filed on Jun. 16, 2006. These patent applications are hereby incorporated herein by reference.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. We claim all such modifications and variations that fall within the scope and spirit of the claims below. The specification and drawings are, accordingly, to be regarded as illustrative rather than restrictive. It will be recognized that the terms "comprising," "including," and "having," as used herein, are specifically intended to be read as open-ended terms of art.

I claim:

1. A capacitive micromachined ultrasound transducer (cMUT), comprising:
    a substrate;
    a curved membrane disposed on top of the substrate, the curved membrane having a raised portion higher than a recessed portion relative to the substrate, the raised portion being supported by a support standing on a major surface of the substrate, wherein at least one of the curved membrane and the substrate has a first electrode; and
    a flexible membrane disposed on top of the curved membrane, either directly or indirectly supported by the curved membrane, wherein the flexible membrane has a second electrode opposing the first electrode to define a gap width therebetween.

2. The capacitive micromachined ultrasonic transducer as recited in claim 1, wherein the flexible membrane is directly supported by the raised portion of the curved membrane.

3. The capacitive micromachined ultrasonic transducer as recited in claim 1, wherein the flexible membrane is indirectly supported by the recessed portion of the curved membrane through a second support placed on the recessed portion, the second support being higher than the raised portion of the curved membrane.

4. The capacitive micromachined ultrasonic transducer as recited in claim 1, wherein the support is formed out of the substrate.

5. The capacitive micromachined ultrasonic transducer as recited in claim 1, wherein the substrate is conductive.

6. The capacitive micromachined ultrasonic transducer as recited in claim 1, wherein the curved membrane is conductive.

7. The capacitive micromachined ultrasonic transducer as recited in claim 1, further comprising:
    an insulation layer disposed on a top surface the curved membrane facing the flexible membrane.

8. The capacitive micromachined ultrasonic transducer as recited in claim 1, wherein the curved membrane is a separate wafer material bonded to the substrate.

9. The capacitive micromachined ultrasonic transducer as recited in claim 1, wherein the support is aligned closely at a highest point of the raised portion of the curved membrane.

10. An array of capacitive micromachined ultrasound transducers (cMUT), each cMUT comprising:
    a substrate;
    a curved membrane disposed on top of the substrate, the curved membrane having a raised portion higher than a recessed portion relative to the substrate, the raised portion being supported by a support standing on a major surface of the substrate, wherein at least one of the curved membrane and the substrate has a first electrode; and
    a flexible membrane disposed on top of the curved membrane, either directly or indirectly supported by the curved membrane, wherein the flexible membrane has a second electrode opposing the first electrode to define a gap width therebetween.

11. The array of capacitive micromachined ultrasonic transducers as recited in claim 10, wherein the flexible membrane is directly supported by the raised portion of the curved membrane.

12. The array of capacitive micromachined ultrasonic transducers as recited in claim 10, wherein the flexible membrane is indirectly supported by the recessed portion of the curved membrane through a second support placed on the recessed portion, the second support being higher than the raised portion of the curved membrane.

13. The array of capacitive micromachined ultrasound transducers as recited in claim 10, wherein the substrate is conductive.

14. The array of capacitive micromachined ultrasound transducers as recited in claim 10, wherein the curved membrane is a separate wafer material bonded to the substrate.

15. A method for fabricating a capacitive micromachined ultrasound transducer (cMUT), the method comprising:
    providing a substrate;
    forming a support on the substrate;
    forming a curved membrane on the substrate, the curved membrane including a raised area higher than a recessed area relative to the substrate, wherein at least one of the curved membrane and the substrate has a first electrode; and
    forming a flexible membrane layer over the first wafer, the flexible membrane being either directly or indirectly supported by the curved membrane, wherein the flexible membrane has a second electrode opposing the first electrode to define a gap width therebetween.

16. The method as recited in claim 15, wherein the forming the curved membrane comprises:
    forming a bendable layer having a desired thickness profile;
    placing the bendable layer over the substrate such that the bendable layer is supported by the support, and the bendable layer and the substrate define a cavity therebetween; and
    bending the bendable layer to form the curved membrane.

17. The method of claim 15, wherein the recessed area of the curved membrane touches the substrate.

18. The method of claim 15 wherein the forming the curved membrane comprises annealing the curved membrane at a desired temperature and pressure.

19. The method of claim 15 wherein the curved membrane comprises a semiconductor material.

20. The method of claim 15, wherein the forming the curved membrane comprises:
   selectively doping a membrane layer using a doping material with doping profile to introduce a desired stress profile in the first layer; and
   annealing the membrane layer at a desired temperature and pressure to form the curved membrane.

21. A method for fabricating a capacitive micromachined ultrasound transducer (cMUT), the method comprising:
   forming a support on a wafer;
   joining the wafer to a substrate such that the support touches the substrate;
   forming a curved membrane by bending the wafer, the curved membrane including a raised area higher than a recessed area relative to the substrate, and the raised area being aligned with the support; and
   forming a flexible membrane layer over the curved membrane, the flexible membrane being either directly or indirectly supported by the curved membrane.

22. The method of claim 21, wherein forming the curved membrane comprises:
   thinning the wafer to a membrane thickness; and
   bending the thinned wafer.

23. The method of claim 21, wherein the recessed area of the curved membrane touches the substrate.

24. The method of claim 21, wherein the forming the curved membrane comprises:
   selectively doping the wafer using a doping material with doping profile to introduce a desired stress profile in the wafer; and
   annealing the wafer at a desired temperature and pressure to form the curved membrane.

* * * * *